(12) United States Patent
Tran et al.

(10) Patent No.: US 10,741,300 B2
(45) Date of Patent: Aug. 11, 2020

(54) CONDUCTIVE PASTE COMPOSITION AND SEMICONDUCTOR DEVICES MADE THEREWITH

(71) Applicant: E I DU PONT DE NEMOURS AND COMPANY, Wilmington, DE (US)

(72) Inventors: Hoang Vi Tran, Wilmington, DE (US); Hee Hyun Lee, Wilmington, DE (US); Michael Stephen Wolfe, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 15/714,030

(22) Filed: Sep. 25, 2017

(65) Prior Publication Data
US 2018/0102198 A1    Apr. 12, 2018

Related U.S. Application Data

(60) Provisional application No. 62/405,293, filed on Oct. 7, 2016.

(51) Int. Cl.
| | |
|---|---|
| *H01B 1/22* | (2006.01) |
| *C03C 3/14* | (2006.01) |
| *C03C 8/22* | (2006.01) |
| *C03C 8/18* | (2006.01) |
| *C03C 8/16* | (2006.01) |
| *C08L 83/04* | (2006.01) |
| *C03C 8/10* | (2006.01) |
| *C08G 77/04* | (2006.01) |

(Continued)

(52) U.S. Cl.
CPC .............. *H01B 1/22* (2013.01); *C03C 3/142* (2013.01); *C03C 8/10* (2013.01); *C03C 8/16* (2013.01); *C03C 8/18* (2013.01); *C03C 8/22* (2013.01); *C08G 77/04* (2013.01); *C08L 83/04* (2013.01); *C09D 5/24* (2013.01); *H01L 31/022425* (2013.01); *H01L 31/18* (2013.01); *Y02E 10/50* (2013.01)

(58) Field of Classification Search
CPC ................................................ H01L 31/022425
USPC ......................................... 136/256; 252/512
See application file for complete search history.

(56) References Cited

U.S. PATENT DOCUMENTS

| | | |
|---|---|---|
| 7,494,607 B2 | 2/2009 | Wang et al. |
| 8,497,420 B2 | 7/2013 | Carroll et al. |

(Continued)

FOREIGN PATENT DOCUMENTS

| | | |
|---|---|---|
| CN | 101645318 A | 2/2010 |
| CN | 103915132 A | 7/2014 |

(Continued)

OTHER PUBLICATIONS

Wang, J., "Glass viscosity and structural relaxation by parallel plate rheometry using a thermo-mechanical analyser", Materials Letters, vol. 31, 1997, pp. 99-103.

(Continued)

*Primary Examiner* — Khanh T Nguyen

(57) ABSTRACT

The present invention provides a thick-film paste composition for printing the front side of a solar cell device having one or more insulating layers. The thick-film paste comprises an electrically conductive metal and an oxide composition dispersed in an organic medium that includes microgel particles and an organopolysiloxane.

22 Claims, 4 Drawing Sheets

(51) Int. Cl.
*C09D 5/24* (2006.01)
*H01L 31/0224* (2006.01)
*H01L 31/18* (2006.01)

(56) References Cited

U.S. PATENT DOCUMENTS

| | | |
|---|---|---|
| 8,808,581 B2 | 8/2014 | Vernooy et al. |
| 8,889,979 B2 | 11/2014 | Carroll et al. |
| 8,895,843 B2 | 11/2014 | Carroll et al. |
| 2014/0124713 A1 | 5/2014 | Majumdar et al. |
| 2016/0190360 A1 | 6/2016 | Jung et al. |
| 2016/0225925 A1* | 8/2016 | Wolfe ............. H01L 31/022425 |

FOREIGN PATENT DOCUMENTS

| | | |
|---|---|---|
| JP | 2010-087251 A | 4/2010 |
| JP | 5957546 B2 | 7/2016 |
| JP | 6084270 B1 | 2/2017 |
| JP | 2017-092253 A | 5/2017 |
| JP | 2017-152520 A | 8/2017 |
| JP | 6236156 B2 | 11/2017 |
| WO | 2010/123967 A2 | 10/2010 |
| WO | 2011/055995 A2 | 5/2011 |
| WO | 2013/036510 A1 | 3/2013 |
| WO | 2014/059577 A1 | 4/2014 |
| WO | 2016/111299 A1 | 7/2016 |
| WO | 2016/194882 A1 | 12/2016 |

OTHER PUBLICATIONS

Dow Cellulosics, "Ethocel Ethylcellulose Polymers Technical Handbook", Dow Chemical Company, Sep. 2005.
ASTM Standard Test Method E-1356-08.
ASTM Standard Test Method C1351M-96.
ASTM C338-93.

* cited by examiner

CONDUCTIVE PASTE COMPOSITION AND SEMICONDUCTOR DEVICES MADE THEREWITH

CROSS-REFERENCE TO RELATED APPLICATION

This application claims benefit of U.S. Provisional Patent Application Ser. No. 62/405,293, filed Oct. 7, 2016, and entitled "Conductive Paste Composition and Semiconductor Devices Made Therewith," which application is incorporated herein in its entirety for all purposes by reference thereto.

FIELD OF THE INVENTION

The present disclosure relates to a conductive paste composition that is useful in the construction of a variety of electrical and electronic devices, and more particularly to a paste composition useful in creating conductive structures, including electrodes for photovoltaic devices, devices constructed with such paste compositions, and a process for constructing these devices.

TECHNICAL BACKGROUND

Photovoltaic (PV) devices (also called solar cells) are now widely used to convert incident sunlight into usable electrical energy, which can supply an external load of any desired type. The cells are provided with electrodes that are configured to be connected to wires through which the generated electricity flows to the load. Of course, it is desired that the generation and transmission of energy be done as efficiently as possible, to maximize the amount of the incident solar energy that can be captured and turned into usable electrical energy. Technologists have devoted attention in recent years to many ways of increasing that efficiency. Solar-powered photovoltaic systems are considered to be environmentally beneficial in that they reduce the need for older forms of generation, such as burning fossil fuels in conventional electric power plants.

Conventional solar cells are based on a structure that includes a junction between semiconducting materials with different majority-carrier conductivity types, such as a p-n junction formed between an n-type semiconductor and a p-type semiconductor. More specifically, crystalline Si photovoltaic cells are typically made by adding controlled impurities (called dopants) to purified silicon, which is an intrinsic semiconductor. Dopants from IUPAC group 13 (e.g., B) are termed "acceptor dopants" and produce p-type material, in which the majority charge carriers are positive "holes," or electron vacancies. Dopants from IUPAC group 15 (e.g., P) are termed "donor dopants" and produce n-type material, in which the majority charge carriers are negative electrons. Dopants may be added to bulk materials by direct inclusion in the melt during silicon crystal growth. Doping of a surface is often accomplished by providing the dopant at the surface in either liquid or gaseous form, and then thermally treating the base semiconductor to cause the dopants to diffuse inward. Ion implantation, possibly with further heat treatment, is also used for surface doping.

The cell structure includes a boundary or junction between p-type and n-type Si. When the cell is illuminated by electromagnetic radiation of an appropriate wavelength, such as sunlight, a potential (voltage) difference develops across the junction as the electron-hole pair charge carriers migrate into the electric field region of the p-n junction and become separated. The spatially separated charge carriers are collected by electrodes in contact with the surfaces of the semiconductor. The cell is thus adapted to supply electric current to the connected electrical load. Since sunlight is almost always the light source, photovoltaic cells are commonly known as "solar cells."

In the commonly used planar p-base configuration, a negative electrode is located on the side of the cell that is to be exposed to a light source (the "front," "light-receiving," or "sun" side; a positive electrode is located on the other side of the cell (the "back" or "non-illuminated" side). Cells having a planar n-base configuration, in which the p- and n-type regions are interchanged from the p-base configuration, are also known.

Both electrodes are normally provided by suitable metallizations, i.e., thin layers of electrically conductive metal situated on some or all of one or both surfaces of the cell. Most commonly, these electrodes are provided on opposite sides of a generally planar cell structure. Conventionally, they are produced by applying suitable conductive metal pastes to the respective surfaces of the semiconductor body and thereafter firing the pastes. For example, U.S. Pat. No. 8,497,420 discloses a method of manufacturing a solar cell electrode comprising steps of: applying onto a semiconductor substrate a conductive paste comprising (i) a conductive powder such as Ag, (ii) a lead-tellurium-oxide based glass frit, (iii) ethyl cellulose as an organic polymer, (iv) suitable thixotropes and surfactants; and (v) a solvent comprising predominantly 2,2,4-trimethyl-1,3-pentanediol monoisobutyrate; and firing the conductive paste to produce an electrode suitable for devices such as solar cells.

Most photovoltaic cells are fabricated with an insulating layer on their front side to afford an anti-reflective property that maximizes the utilization of incident light. However, in this configuration, the insulating layer normally must be removed to allow an overlaid front-side electrode metallization to make contact with the underlying semiconductor surface. Conductive metal pastes appointed for fabricating front side electrodes typically include a glass frit and a conductive species (e.g., silver particles) carried in an organic medium that functions as a vehicle for printing. The electrode may be formed by depositing the paste composition in a suitable pattern (for instance, by screen printing) and thereafter firing the paste composition and substrate.

The specific formulation of the paste composition has a strong but highly unpredictable effect on both the electrical and mechanical properties of electrodes constructed therewith. To obtain good electrical characteristics for the finished cell (e.g., high light conversion efficiency and low resistance), the composition must penetrate or etch fully through the anti-reflective layer during firing so that a good electrical contact is established, but without damaging the underlying semiconductor.

Ideally, the electrode has high electrical conductivity and a low-resistance connection to the underlying device to minimize the loss of efficiency from ohmic heating within the cell. In addition, it is desirable for the total area of the electrode to be as small as possible to avoid the loss of efficiency that results from shadowing of the incident light on the light-receiving surface. Ordinarily, these requirements necessitate a structure that includes plural fine conductive lines. The conductivity of the lines is improved by increasing their cross-sectional area in the plane perpendicular to their length. But to minimize shadowing, the fired line should be high but narrow. However, with existing paste compositions, it has proven difficult both to form such lines by screen printing and to prevent excessive line spreading during firing. It is further desired that a strongly adhering bond between the electrode and the substrate upon firing is formed. Still further, it is desirable that the vehicle is completely removed during firing, so that there is no residue that degrades the conductivity of the electrode. With many conventional paste compositions, it thus has not proven possible to reliably fire the printed wafers so that good adhesion and electrical properties are obtained in combination.

Although various methods and compositions useful in forming devices such as photovoltaic cells are known, there nevertheless remains a need for compositions that permit fabrication of patterned conductive structures that provide improved overall device electrical performance and that facilitate the rapid and efficient manufacture of such devices in both conventional and novel architectures.

SUMMARY

An aspect of the present disclosure provides a paste composition, comprising:
an inorganic solids portion that comprises:
  (a) a source of electrically conductive metal, and
  (b) an inorganic oxide-based component, and
a vehicle in which the constituents of the inorganic solids portion are dispersed, the vehicle comprising:
  (c) microgel particles;
  (d) organopolysiloxane; and
  (e) a solvent.

Another aspect provides a process comprising:
  (a) providing a semiconductor substrate having opposing first and second major surfaces;
  (b) applying a paste composition as recited herein onto at least a portion of the first major surface, and
  (c) firing the semiconductor substrate and the paste composition under conditions sufficient to form an electrode in electrical contact with the semiconductor substrate.

Still another aspect provides a photovoltaic cell precursor comprising:
  (a) a substrate having opposing first and second major surfaces; and
  (b) a paste composition as recited herein, the paste composition being applied onto a preselected portion of the first major surface and configured to be formed by a firing operation into an electrically conductive structure comprising an electrode in electrical contact with the substrate.

The disclosure further provides an article made by the foregoing process. The substrate used may be a silicon wafer and the article may be a photovoltaic cell or other semiconductor device.

BRIEF DESCRIPTION OF THE DRAWINGS

The invention will be more fully understood and further advantages will become apparent when reference is made to the following detailed description of the preferred embodiments of the invention and the accompanying drawings, wherein like reference numerals denote similar elements throughout the several views and in which.

DETAILED DESCRIPTION

Figure 1A:
FIGS. 1A to 1F are drawings in cross-section view for explaining a solar cell electrode manufacturing process.

Various aspects of the present disclosure relate to the need for high performance semiconductor, photovoltaic, and other electronic devices having mechanically robust and durable, high conductivity electrodes as well as processes suitable for their manufacture.

One aspect provides a paste composition that comprises as functional inorganic materials a conductive component, such as a source of electrically conductive metal and an oxide-based component such as a glass frit that are dispersed in a predominantly organic vehicle that comprises a microgel and an organopolysiloxane, along with solvent and other functional agents such as polymers, surfactants, thickeners, thixotropes, and binders. In another aspect, the paste composition is beneficially employed in the fabrication of high-quality electrodes of photovoltaic devices. Ideally, the paste composition promotes the formation of a metallization that: (a) provides a relatively low resistance contact with the substrate; (b) preserves the electrical characteristics of the underlying substrate; and (c) adheres strongly to the underlying semiconductor substrate. A PV cell employing such a metallization as one or both of its electrodes ideally exhibits good electrical and mechanical characteristics, including one or more of high photovoltaic conversion efficiency, high fill factor, low series resistance, high shunt resistance, and good mechanical adhesion between the electrode and the substrate. Suitable paste compositions are believed to aid in etching surface insulating layers, which are ordinarily included in semiconductor structures such as photovoltaic cells, as required for making good contact between the conductive electrode and the underlying semiconductor.

As further described below, the vehicle of the paste composition acts as a carrier for the inorganic solids constituents, which are dispersed therein. Along with solvent, the vehicle may include one or more components such as polymers, surfactants, thickeners, thixotropes, and binders that may impart desirable functional properties, including without limitation ones desirable in deposition and electrode formation processes. The vehicle is predominantly composed of organic materials, but small amounts of inorganic materials that enhance the functionality of the vehicle are optionally included.

Typically, electrodes or other like conductive traces are provided by screen printing the paste composition onto a substrate, although other forms of deposition may alternatively be used, including, without limitation, plating, extrusion or co-extrusion, dispensing from a syringe, inkjet, shaped, multiple, or ribbon printing. After deposition, the composition is fired at an elevated temperature. A separate drying step is optionally carried out prior to the actual firing.

The present composition also can be used to form conductive traces for other purposes, such as those employed in a semiconductor module that is to be incorporated into an electrical or electronic device. As would be recognized by a skilled artisan, the paste composition described herein can be termed "conductive," meaning that the composition can be formed into a structure and thereafter processed to exhibit an electrical conductivity sufficient for conducting electrical current between devices and circuitry connected thereto.

I. Inorganic Components

A. Electrically Conductive Metal

The present paste composition includes a source of an electrically conductive metal. Exemplary metals include without limitation silver, gold, copper, nickel, palladium, platinum, aluminum, and alloys and mixtures thereof. In some embodiments, the electrically conductive metal is selected from the group consisting of Ag, Cu, and Pd; alternatively, the electrically conductive metal consists essentially of silver, which is beneficial for its processability and high conductivity. However, a composition including at least some non-precious metal may be used to reduce cost or to modify other properties.

The conductive metal may be incorporated directly in the present paste composition as a metal powder. In another embodiment, a mixture of two or more such metals or an alloy is directly incorporated. Alternatively, the metal is supplied by a metal oxide or salt that decomposes upon exposure to the heat of firing to form the metal. As used herein, the term "silver" is to be understood as referring to elemental silver metal, alloys of silver, and mixtures thereof, and may further include silver derived from silver oxide ($Ag_2O$ or $AgO$) or silver salts such as $AgCl$, $AgNO_3$, $AgOOCCH_3$ (silver acetate), $AgOOCF_3$ (silver trifluoroacetate), $Ag_3PO_4$ (silver orthophosphate), or mixtures thereof. Any other form of conductive metal compatible with the other components of the paste composition also may be used in certain embodiments. Other metals used in the present paste for the functional conductive material may be similarly derived.

Electrically conductive metal powder used in the present paste composition may be supplied as finely divided particles having any morphology, including without limitation, any one or more of the following morphologies: a powder form, a flake form, a spherical form, a rod form, a granular form, a nodular form, a layered or coated form, other irregular forms, or mixtures thereof. The electrically conductive metal or source thereof may also be provided in a colloidal suspension, in which case the colloidal carrier would not be included in any calculation of weight percentages of the solids of which the colloidal material is part.

The particle size of the metal is not subject to any particular limitation. As used herein, "particle size" is intended to refer to "median particle size" or $d_{50}$, by which is meant the 50% volume distribution size. The particle size distribution may also be characterized by $d_{90}$, meaning that 90% by volume of the particles are smaller than $d_{90}$. Volume distribution size may be determined by a number of methods understood by one of skill in the art, including but not limited to laser diffraction and dispersion methods employed by a Microtrac particle size analyzer (Montgomeryville, Pa.). Laser light scattering, e.g., using a model LA-910 particle size analyzer available commercially from Horiba Instruments Inc. (Irvine, Calif.), may also be used. In various embodiments, the median size of the metal particles ranges between 0.01, 0.2, 0.3, or 0.5 μm and 10 μm; or between 0.3, 0.4, or 0.5 μm and 5 or 8 μm, as measured using the Horiba LA-910 or Microtrak analyzers. Particles having diameters in these ranges are found to sinter well. Furthermore, the particle diameter should be commensurate with the functioning of the method used to apply the conductive paste onto a semiconductor substrate, for example, screen printing. In an embodiment, it is possible to mix two or more types of conductive powder of different diameters and/or morphologies.

In an embodiment, the conductive powder is of ordinary high purity (99%). However, depending on the electrical requirements of the electrode pattern, conductive powders with higher or lower purity can also be used.

As further described below, the electrically conductive metal or a source thereof is dispersed in a vehicle that acts as a carrier for the metal phase and other constituents present in the formulation. The electrically conductive metal may comprise any of a variety of percentages of the composition of the paste composition. To attain high conductivity in a finished conductive structure, it is generally preferable for the concentration of the electrically conductive metal to be as high as possible while maintaining other required characteristics of the paste composition that relate to either processing or final use, such as the need for a uniform, mechanically robust and adherent contact and adequate penetration of any surface passivation and/or anti-reflective coating present on the substrate. Minimizing the bulk resistivity and the contact resistance between the conductive structure and the underlying device beneficially tends to decrease the source resistance of a device.

In an embodiment, the conductive powder comprises 50 weight percent (wt %) or more of the total weight of the conductive paste. In other embodiments, the conductive powder comprises an amount of the conductive paste between a lower limit of 50, 60, 70, 75, 80, or 85 wt. % and an upper limit of 80, 82.5, 85, 87.5, 90, 92.5, or 95 wt. %. In other embodiments, the silver or other electrically conductive metal may comprise about 75% to about 99.75% by weight, or about 85% to about 99.5% by weight, or about 95% to about 99% by weight, of the inorganic solids component of the paste composition. In another embodiment, the solids portion of the paste composition may include about 80 wt. % to about 90 wt. % silver particles and about 1 wt. % to about 9 wt. % silver flakes. In an embodiment, the solids portion of the paste composition may include about 70 wt. % to about 90 wt. % silver particles and about 1 wt. % to about 9 wt. % silver flakes. In another embodiment, the solids portion of the paste composition may include about 70 wt. % to about 90 wt. % silver flakes and about 1 wt. % to about 9 wt. % of colloidal silver. In a further embodiment, the solids portion of the paste composition may include about 60 wt. % to about 90 wt. % of silver particles or silver flakes and about 0.1 wt. % to about 20 wt. % of colloidal silver.

The electrically conductive metal used herein, particularly when in powder form, may be coated or uncoated; for example, it may be at least partially coated with a surfactant to facilitate processing. Suitable coating surfactants include, for example, stearic acid, palmitic acid, a salt of stearate, a salt of palmitate, and mixtures thereof. Other surfactants that also may be utilized include lauric acid, oleic acid, capric acid, myristic acid, linoleic acid, and mixtures thereof. Still other surfactants that also may be utilized include polyethylene oxide, polyethylene glycol, benzotriazole, poly(ethylene glycol)acetic acid, and other similar organic molecules. Suitable counter-ions for use in a coating surfactant include without limitation hydrogen, ammonium, sodium, potassium, and mixtures thereof. When the electrically conductive metal is silver, it may be coated, for example, with a phosphorus-containing compound. It is understood that the paste composition may separately include one or more surfactants, apart from any surfactant present as a coating of conductive metal powder.

B. Oxide Component

The present paste composition includes a fusible inorganic oxide material. The term "fusible," as used herein, refers to the ability of a material to become fluid upon heating, such as the heating employed in a firing operation. In some embodiments, the fusible material is composed of one or more fusible subcomponents. For example, the fusible material may comprise a glass material, or a mixture of two or more glass materials that may have different softening and/or melting characteristics. Glass material in the form of a fine powder, e.g., as the result of a comminution operation, is often termed "frit" and is beneficially employed as the oxide material of some embodiments of the present paste composition.

While the present invention is not limited by any particular theory of operation, it is believed that in some embodiments, the glass frit (or other like oxide material) and the frit additive (if present) act in concert during firing to efficiently penetrate the insulating layer normally present on the wafer, such as a naturally occurring or intentionally formed passivation layer and/or an antireflective coating. Such a result is frequently termed "firing through." The glass frit and frit additive are also thought to promote sintering of the conductive metal powder, e.g. silver, that forms the electrode in some embodiments.

As used herein, the term "glass" refers to a particulate solid form, such as an oxide or oxyfluoride, that is at least predominantly amorphous, meaning that short-range atomic order is preserved in the immediate vicinity of any selected atom, that is, in the first coordination shell, but dissipates at greater atomic-level distances (i.e., there is no long-range periodic order). Hence, the X-ray diffraction pattern of a fully amorphous material exhibits broad, diffuse peaks, and not the well-defined, narrow peaks of a crystalline material. In the latter, the regular spacing of characteristic crystallographic planes give rise to the narrow peaks, whose position in reciprocal space is in accordance with Bragg's law.

Upon initial heating, glass materials undergo certain structural changes typically denominated as the glass transition. In general, and without being bound by any theory, it is understood that there is a transition from a low temperature state in which the constituent atoms are tightly bound, to a semi-viscous state, in which thermal energy permits the atoms to become more mobile. The glass transition is manifested in changes that can be seen in measurements of a variety of physical phenomena, including without limitation calorimetric and mechanical measurements.

In accordance with typical usage in the art of glass chemistry, the term "glass transition temperature," or "$T_g$," is used herein to refer to the onset temperature for this transition as measured calorimetrically. As described in ASTM Standard Test Method E-1356-08, $T_g$ is conveniently determined empirically using conventional DSC or DTA measurements, as the temperature of intersection of two tangents drawn to the calorimetric curve, one in the baseline region below the transition region and one at the steepest portion of the curve in the transition region. DSC and DTA data are frequently collected at a constant heating rate of 10° C./min. (ASTM Standard Test Methods are promulgated by ASTM International, West Conshohocken, Pa. Each such ASTM standard referenced herein is incorporated in its entirety for all purposes by reference thereto.) The softening point of a fusible material herein is understood to represent the temperature ($T_s$) above which the logarithm of the material's viscosity n (measured in Pa·s) drops below 6.6, in accordance with conventional usage, e.g. as set forth in "Materials Letters," Vol. 31, p 99-103 (1997) and ASTM Standard Test Method C1351M-96.

In an embodiment, the softening point of glass material used in the present paste composition is in the range of 300 to 800° C. In other embodiments, the softening point is in the range of 250 to 650° C., or 300 to 500° C., or 300 to 400° C., or 390 to 600° C., or 400 to 550° C., or 410 to 460° C. Glass frits having such softening points can melt properly to obtain effects such as those mentioned above. Alternatively, the "softening point" can be obtained by the fiber elongation method of ASTM C338-93.

It is also contemplated that some or all of the fusible oxide material may be composed of material that exhibits some degree of crystallinity. For example, in some embodiments, a plurality of oxides are melted together, resulting in a material that is partially amorphous and partially crystalline. As would be recognized by a skilled person, such a material would produce an X-ray diffraction pattern having narrow, crystalline peaks superimposed on a pattern with broad, diffuse peaks. Alternatively, one or more constituents, or even substantially all of the fusible material, may be predominantly or even substantially fully crystalline. In certain embodiments, crystalline material useful in the fusible material of the present paste composition may have a melting point of at most 700° C., 750° C., or 800° C.

Ordinarily, the particle size of the oxide material is not critical, provided the paste can be uniformly prepared and deposited. In certain embodiments, the median particle size of the oxide material can range from a lower limit of 0.1, 0.3, 0.4, 0.5, 0.6, or 0.8 µm to an upper limit of 1, 3, 5, 7, or 10 µm. With such particle size, the oxide material can be uniformly dispersed in the paste. The particle size ($d_{50}$) can be obtained in the same manner as described above for the conductive powder.

The chemical composition of the oxide material or glass frit of the present paste composition is not limited. Any glass frit suitable for use in electrically conducting pastes for electronic materials is acceptable. For example, and without limitation, lead borosilicate, lead silicate, and lead tellurium glass frits can be used. For example, lead tellurium oxide-containing glass frits useful in the present paste composition include without limitation ones provided by U.S. Pat. Nos. 8,497,420, 8,895,843, and 8,889,979, which are all incorporated herein for all purposes by reference thereto. In an embodiment, the glass frit comprises a lead tellurium oxide, such as one comprising PbO and $TeO_2$, with a mole ratio of lead to tellurium of the oxide being between 5/95 and 95/5. In other embodiments, the glass frit comprises a lead tellurium boron oxide or a lead tellurium lithium oxide. Any of these glass frits may comprise any of: 10 to 75, 25 to 60, or 30 to 50 wt % of PbO; 10 to 70, 25 to 65, or 40 to 60 wt % $TeO_2$; 0.1 to 15, 0.25 to 5, or 0.4 to 2 wt % $B_2O_3$; or 0.1 to 7.5, 0.2 to 5, 0.2 to 3, or 0.3 to 1 wt. % $Li_2O$. In addition, zinc borosilicate or other lead-containing or lead-free glasses can be also used.

In various embodiments, the glass frit can be 0.25 to 12 wt %, 0.25 to 8 wt %, 0.5 to 6 wt %, 0.5 to 4 wt %, or 1.0 to 3 wt % based on the total weight of the conductive paste.

The embodiments of the glass frit or like material described herein are not limiting. It is contemplated that one of ordinary skill in the art of glass chemistry could make minor substitutions of additional ingredients and not substantially change the desired properties of the given composition, including its interaction with a substrate and any insulating layer thereon.

The oxide component of the present paste composition is understood to refer to a composition containing anions of one or more types, of which at least 80% are oxygen anions, and cations. In various embodiments, at least 90%, 95%, 98%, or substantially all the anions of the oxide component are oxygen anions.

In some embodiments, the oxide component comprises a mixture of finely divided powders of at least two separate fusible materials that have distinct chemical compositions. Each of the fusible materials independently may be either crystalline or partially or fully glassy or amorphous. In most embodiments, at least the first fusible material is a glass frit material. The at least two fusible materials have different softening and/or melting characteristics. In an embodiment, the different behavior operates to enhance the electrical and mechanical characteristics obtained after firing the solar cell precursor.

A median particle size of the fusible materials in the present composition may be in the range of about 0.5 to 10 µm, or about 0.8 to 5 µm, or about 1 to 3 µm, as measured using the Horiba LA-910 analyzer.

In an embodiment, the thick film paste may include the oxide composition in an amount of 0.25 to 15%, 0.25 to 8%, 0.5 to 5%, or 1 to 3% by weight based on solids.

One of ordinary skill in the art of glass chemistry would recognize that the fusible materials herein are commonly described as including percentages of certain components. Specifically, the composition of the fusible materials can be specified by denominating individual components that may be combined in the specified percentages to form a starting material that subsequently is processed, e.g., as described herein, to form a glass or other fusible material. Such nomenclature is conventional to one of skill in the art. In other words, the fusible materials contain certain components, and the percentages of those components may be expressed as weight percentages of the corresponding oxide or other forms.

Alternatively, the composition of the fusible material herein may be expressed in cation percentages, which are based on the total cations contained in the particular material, unless otherwise indicated by the context. Of course, compositions thus specified include the oxygen or other anions associated with the various cations in the amounts required for charge balance. A skilled person would recognize that compositions could equivalently be specified by weight percentages of the constituents, and would be able to perform the required numerical conversions.

A skilled person would further recognize that any of the fusible materials herein, whether specified by weight percentages, molar percentages, or cation percentages, e.g. of the constituent oxides, may alternatively be prepared by supplying the required anions and cations in requisite amounts from different components that, when mixed and heated, yield the same overall composition. For example, in various embodiments, lithium for the compound $Li_2O$ could be supplied either from the oxide directly or alternatively from a suitable organic or inorganic lithium-containing compound (such as $Li_2CO_3$) that decomposes on heating to yield $Li_2O$. The skilled person would also recognize that a certain portion of volatile species, e.g., carbon dioxide, may be released during the process of making a fusible material.

It is known to those skilled in the art that the cations of some of the oxides described herein exist in more than one stable valence or oxidation state. For example, cobalt is known in multiple possible oxidation states, with cobalt(II), cobalt(III), and cobalt(II,III) oxides, respectively having formulas $CoO$, $Co_2O_3$, and $Co_3O_4$, being reported. Fusible materials herein that include such cations can be prepared using any of the known oxides, or compounds that form oxides upon heating in air.

A skilled person would also recognize that a fusible material such as one prepared by a melting technique as described herein may be characterized by known analytical methods that include, but are not limited to: Inductively Coupled Plasma-Emission Spectroscopy (ICP-ES), Inductively Coupled Plasma-Atomic Emission Spectroscopy (ICP-AES), and the like. In addition, the following exemplary techniques may be used: X-Ray Fluorescence spectroscopy (XRF), Nuclear Magnetic Resonance spectroscopy (NMR), Electron Paramagnetic Resonance spectroscopy (EPR), Mössbauer spectroscopy, electron microprobe Energy Dispersive Spectroscopy (EDS), electron microprobe Wavelength Dispersive Spectroscopy (WDS), and Cathodoluminescence (CL). A skilled person could calculate percentages of starting components that could be processed to yield a particular fusible material, based on results obtained with such analytical methods.

One of ordinary skill in the art would recognize that the choice of raw materials could unintentionally include impurities that may be incorporated into the glass during processing. For example, the impurities may be present in the range of hundreds to thousands ppm. The presence of the impurities would not alter the properties of the glass, the thick film composition, or the fired device. For example, a solar cell containing the thick-film composition may have the efficiency described herein, even if the thick-film composition includes impurities.

Preparation of Fusible Materials

In an embodiment, the fusible materials comprised in the present oxide composition may be produced using any suitable technique and equipment, including those conventionally employed in the glass-making arts. For example, the ingredients may be weighed and mixed in the requisite proportions and then heated in a platinum alloy crucible in a furnace at a temperature sufficient to melt the constituents together. The ingredients may be heated to a peak temperature (e.g., 800° C. to 1400° C., or 1000° C. to 1200° C., or 900° C. to 1050° C.) and held for a time such that the material forms a melt that is substantially liquid and homogeneous (e.g., 20 minutes to 2 hours). The melt optionally is stirred, either intermittently or continuously. In an embodiment, the melting process results in a material wherein the constituent chemical elements are homogeneously and intimately mixed at an atomic level. The molten material is then typically quenched in any suitable way including, without limitation, passing it between counter-rotating stainless steel rollers to form 0.25 to 0.50 mm thick platelets, by pouring it onto a thick stainless steel plate, or by pouring it into a suitable quench fluid. The resulting particles are then milled to form a powder or frit, which typically may have a $d_{50}$ of 0.2 to 3.0 µm (e.g. as measured using a Horiba LA-910 analyzer). For example, the milling may be carried out in a polyethylene container with zirconia media and isopropyl alcohol or water optionally containing 0.5 wt % TRITON™ X-100 octylphenol ethoxylate surfactant (available from Dow Chemical Company, Midland, Mich.). The comminuted powder may be recovered by centrifugation or filtration and then dried.

Other production techniques may also be used for the present fusible materials and other oxide-based materials. One skilled in the art of producing such materials might therefore employ alternative synthesis techniques including, but not limited to, melting in non-precious metal crucibles, melting in ceramic crucibles, sol-gel, spray pyrolysis, or others appropriate for making powder forms of glass.

Any size-reduction method known to those skilled in the art can be employed to reduce particle size of the constituents of the present paste composition to a desired level. Such processes include, without limitation, ball milling, media milling, jet milling, vibratory milling, and the like, with or without a solvent present. If a solvent is used, water is the preferred solvent, but other solvents may be employed as well, such as alcohols, ketones, and aromatics. Surfactants may be added to the solvent to aid in the dispersion of the particles, if desired.

C. Optional Oxide Additive

The inorganic oxide material in the present paste composition may optionally comprise a plurality of separate fusible substances, such as one or more frits, or frit with another crystalline frit additive material, or small amounts of other known inorganic additives. Without limitation, one such additive that has been found useful is a lithium ruthenium oxide, as set forth in U.S. Pat. No. 8,808,581 to VerNooy et al., which is incorporated herein by reference thereto for all purposes. In various embodiments, the frit additive may comprise 0.01-2%, 0.05-1.5%, or 0.1-1%, based on the total weight of the conductive paste.

II. Vehicle

The inorganic components of the present composition are typically mixed with a vehicle to form a relatively viscous material referred to as a "paste" or an "ink" that has a consistency and rheology that render it suitable for printing processes, including without limitation screen printing. Without being bound by any theory of operation, it is believed that the vehicle plays an important role in determining the rheology of the paste composition, and thus the ability to print it as fine lines that remain high and narrow after firing, so that shading is minimized and conductivity is increased. The inclusion of a microgel and an organopolysiloxane in combination is believed to be beneficial for improving these characteristics.

The present paste composition is typically formulated with a mechanical mixing system, and the constituents may be combined in any order, as long as they are uniformly dispersed and the final formulation has characteristics such that it can be successfully applied during end use. Mixing methods that provide high shear are especially useful for some formulations.

The vehicle typically provides a medium in which the inorganic components are dispersible with a good degree of stability of the chemical and functional properties of the paste composition. In particular, the paste composition preferably has a stability compatible not only with the requisite manufacturing, shipping, and storage, but also with conditions encountered during deposition, e.g., by a screen printing process. Ideally, the rheological properties of the vehicle are such that it lends good application properties to the paste composition, including stable and uniform dispersion of solids, appropriate viscosity and thixotropy for printing, appropriate wettability of the paste solids and the substrate on which printing will occur, a rapid drying rate after deposition, and stable firing properties. As defined herein, the vehicle is not considered to be part of the inorganic solids comprised in the thick-film paste composition.

Ideally, a firing operation removes the materials contained in the vehicle without leaving any residue that causes effects detrimental to the electrical or mechanical properties of the finished conductive structure or the substrate.

The proportions of vehicle and inorganic solids components in the present paste composition can vary in accordance with the method of applying the paste and the specific composition of the vehicle. In an embodiment, the present paste composition typically contains about 50 to 95 wt. %, 76 to 95 wt. %, or 85 to 95 wt. %, of the inorganic components and about 5 to 50 wt. %, 5 to 24 wt. %, or 5 to 15 wt. %, of the vehicle, and substances associated therewith.

A. Microgel

The present conductive paste composition includes in the vehicle particles of one or more microgels. As used herein, the expression "particles of a microgel" refers to particles of a cross-linked polymer that have a median or average particle size of 20 nm to 2 μm in their unswollen condition. The particles comprise polymer units polymerized from one or more suitable monomers. In various embodiments, the microgel particles may have a median particle size ranging from a lower limit of 20, 50, 75, or 100 nm to an upper limit of 0.8, 1, 1.5, or 2 μm. An ensemble of such microgel particles may be termed a "microgel polymer."

Particles of a microgel composition can be prepared by any process that can polymerize a suitable monomer or combination of monomers. Microgels in some embodiments are produced by an emulsion polymerization process, in which one or more suitable monomers, an effective amount of a cross linker, and a suitable organic solvent are introduced into aqueous solution.

Suitable monomers include, without limitation, vinyl-containing monomers, such as acrylates and methacrylates, or a combination of any such monomers. As used herein, the nomenclature "(meth)acrylate" refers collectively to both acrylates and methacrylates. Similarly, the adjective "(meth)acrylic" is understood to mean either "acrylic" or "methacrylic."

Among the (meth)acrylates usefully prepared as microgel particles that are to be incorporated in the present paste composition, and without limitation, are ethyl acrylate (EA), methyl acrylate (MA), methyl methacrylate (MMA), n-butyl methacrylate (BMA), iso-butyl methacrylate (iBMA), benzyl methacrylate (BzMA), and 2-(2-Oxo-1-imidazolidinyl) ethyl methacrylate (UMA), (meth)acrylamide, (meth)acrylic acid, dimethylaminoethyl (meth)acrylate, stearyl(meth) acrylate, (meth)acrylate phosphate ester, and mixtures thereof in any proportion. Styrene or a functional styrenic may also be used by itself or in combination with other (meth)acrylates. In various embodiments, the present microgel particles may be produced using a mixture of BMA and MMA in any proportion or a mixture of BMA, MMA, and UMA in any proportion.

Optionally, the monomers used in the microgel may include substituents that provide desired functionality, including without limitation hydrogen bonding acceptors or donors or ones that permit adjustment of polarity over a wide range of hydrophobic or hydrophilic interactions. Any operable cross linking agent providing at least difunctionality may be used. A suitable difunctional cross linker is ethylene glycol dimethacrylate (EGDMA). Other useful crosslinkers include, without limitation, 1,4-butanediol dimethacrylate, poly(ethylene glycol) dimethacrylate, glycerol dimethacrylate, glycerol trimethacrylate, diethyleneglycol dimethacrylate, triethyleneglycol dimethacrylate, trimethylolpropane trimethacrylate, or any mixture thereof. In various embodiments, the crosslinker is present in an amount ranging from a lower limit of 0.1, 0.25, or 0.5% to an upper limit of 1, 2, 4, 6, or 8% based on the weight of the total monomer. It is typically found that a lower crosslinker content results in microgel particles that exhibit a higher swelling when they are introduced into a solvent and a higher viscosity at a given concentration.

Acrylate or methacrylate species having trifunctionality or higher may also be used to provide the required cross-linking. Possible triacrylate crosslinkers include, but are not limited to: trimethylol propane triacrylate, isocyanurate triacrylate, glycerol triacrylate, ethoxylated trimethylolpropane triacrylate, propoxylated trimethylolpropane triacrylate, tris (2-hydroxyethyl) isocyanurate triacrylate, ethoxylated glycerol triacrylate, propoxylated glycerol triacrylate, pentaerythritol triacrylate, aryl urethane triacrylates, aliphatic urethane triacrylates, melamine triacrylates, epoxy novolac triacrylates, aliphatic epoxy triacrylate, polyester triacrylate, and mixtures thereof, and any of their methacrylate analogs.

Possible tetraacrylate crosslinkers include, but are not limited to: pentaerythritol tetraacrylate, ethoxylated pentaerythritol tetraacrylate, propoxylated pentaerythritol tetraacrylate, dipentaerythritol tetraacrylate, ethoxylated dipentaerythritol tetraacrylate, propoxylated dipentaerythritol tetraacrylate, aryl urethane tetraacrylates, aliphatic urethane tetraacrylates, melamine tetraacrylates, epoxy novolac tetraacrylates, polyester tetraacrylates and mixtures thereof, and any of their methacrylate analogs.

Some embodiments of the present paste composition comprise microgel particles of a single composition. Other embodiments include microgels of two or more compositions. For example, two microgels may be included that are formed from the same monomer (or mixture of monomers) but have a different type and/or amount of crosslinker. Alternatively, the respective microgels may be formed from different monomers and may have the same or different types and/or amounts of crosslinker. In a further alternative, microgels having different median particle size may be employed.

The solution for emulsion-polymerizing the microgel particles optionally includes one or more of an organic solvent, an initiator, or a surfactant. Then the particles can be removed from the dispersion by heat and/or vacuum. Typically the resulting particles range in median size from 20 nm to 2 μm, as measured in the aqueous dispersion. In an embodiment, the particles (before any swelling from solvent incorporation) range in median size from a lower microgel size limit that is one of 20 nm, 50 nm, 70 nm, or 100 nm, to an upper microgel size limit that is one of 300 nm, 500 nm, 1 μm, 1.5 μm, or 2 μm. Particle size measurement can be done with a laser light scattering technique, e.g. using a Microtrac particle size analyzer (Montgomeryville, Pa.).

Other polymerization techniques suitable for producing microgel particles may also be used including, without limitation, solution polymerization, dispersion polymerization, mini-emulsion polymerization, and precipitation polymerization. If necessary, particles produced by these techniques may be comminuted, e.g. by mechanical grinding, ball milling, jet milling, or the like, to produce a powder that is readily dispersed into a suitable liquid dispersant.

In an embodiment, the microgel particles herein include polymers having molecular weights (in Da) ranging from $10^7$ to $10^{12}$, or from $10^7$ to $10^{10}$, or from $10^8$ to $10^9$. Such molecular weights can be calculated from the particle size of the microgel particles. Useful microgel particles include, without limitation, ones that are swellable upon exposure to a solvent.

In various embodiments, the present paste composition comprises microgel particles in an amount ranging from a lower limit of 0.05%, 0.1%, or 0.2% to an upper limit of 0.5, 0.75%, 1%, 2.5%, or 5% by weight of the total composition. The microgel particles may contain any of the aforementioned amounts of crosslinker. It is typically found that for compositions including higher amounts of microgel particles, the paste composition produces better quality electrodes if the amount of crosslinker used in preparing the microgel is higher.

B. Organopolysiloxane Lubricating Agent

The vehicle of the present conductive paste composition includes at least one organopolysiloxane. Without being bound by any theory, it is believed that the organopolysiloxane acts as a lubricating agent that facilitates the passage of the paste through a screen during printing of fine lines or other defined features of a conductive structure. The term "organopolysiloxane" refers generally to a mixed inorganic-organic polymer that includes an Si—O—Si backbone, as depicted by the structure of Formula (I):

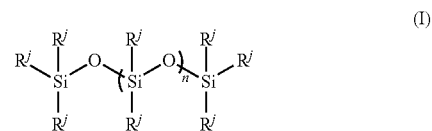

wherein each $R^J$ is independently at each occurrence an organic side group. Each of the $R^J$ groups may be as simple as a lower alkyl or aryl group (e.g., a methyl, ethyl, or phenyl group) or may be an organic group of another type or a larger group, any of which may optionally include substituents; and n is an integer greater than 1. A variety of such organopolysiloxanes are available commercially, e.g. from Gelest, Inc, Morrisville, Pa., and Dow Corning Corporation, Auburn Mich.

Suitable organopolysiloxanes include, without limitation, polyalkylsiloxanes such as polydimethylsiloxane, polydiethylsiloxane, and polyoctylmethylsiloxane; and polyarylsiloxanes such as polydiphenyl siloxane and polymethyl phenyl siloxane. In an embodiment, the siloxanes have the general structure depicted by Formula (II),

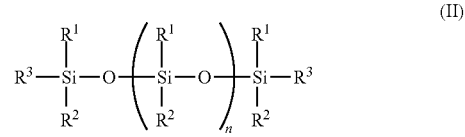

wherein each of the $R^1$, $R^2$, and $R^3$ groups is independently selected from C1-C8 alkyl, C2-C8 alkenyl, C2-C8 alkynyl, or C6-C10 aryl groups; n is an integer ranging from 50 to 100,000. Any one, two, or three of the $R^1$, $R^2$, and $R^3$ groups may be identical, and any of them may optionally comprise one or more substituents selected from alkoxy, hydroxyl, carbonyl, carboxyl, amino, epoxy, methacrylic, glycioxy, ureido, sulfide, methacryloxy, sulfhydryl, and halogen (F, Cl, Br) groups.

In an embodiment, the $R^1$, $R^2$, and $R^3$ groups are all the same, for example all being methyl groups. In other embodiments, $R^1$ and $R^2$ are the same, such as methyl groups, and $R^3$ is another functional group as delineated above, such as a hydroxyl group. In still other embodiments $R^1$ is a group of one type, e.g. a methyl group, and both $R^2$ and $R^3$ are other, different groups, one or both optionally being a functional group as defined above.

Suitable lubricating agents also include organosiloxane copolymers, including random or block copolymers, with a chemical structure (III),

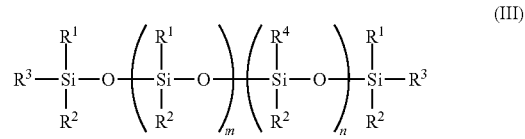

wherein each of $R^1$, $R^2$, $R^3$ and $R^4$ groups is independently selected from C1-C8 alkyl, C2-C8 alkenyl, C2-C8 alkynyl, or C6-C10 aryl group, any of which optionally may comprise one or more substituents selected from alkoxy, hydroxyl, carbonyl, carboxyl, amino, epoxy, methacrylic, glycioxy, ureido, sulfide, methacryloxy, sulfhydryl, and halogen (F, Cl, Br) groups; and m and n are integers, each of which may range independently from 50 to 100,000. The $R^1$ and $R^4$ groups are different from each other. For example, and without limitation, the paste composition may contain alkylmethylsiloxane-arylalkylmethylsiloxane copolymers such as ethylmethylsiloxane-co-2-phenylpropylmethylsiloxane copolymer.

In other embodiments of the present paste composition, the organopolysiloxane includes a mixture in any proportion of more than one of the polymers or copolymers described above.

In an embodiment, the organopolysiloxane used in the present paste composition itself has a kinematic viscosity ranging from about 50 or 100 to about 100,000, 200,000, or 500,000 centistokes (cSt) and forms a phase-segregated mixture when mixed with the rest of vehicle carrier as described herein. The expression "phase-segregated mixture" refers herein to a liquid mixture in which, at room temperature, are present visible liquid domains having an average diameter greater than 0.1 µm, even after vigorous mixing or heating, such as provided by extended centrifugal mixing and heating at 60° C. for 1 h. Suitable mixing can be carried out in a THINKY® mixer (available from Thinky® USA, Inc., Laguna Hills, Calif.) at 2000 rpm for 30 sec. Such domains can be imaged using optical microscopy in either transmission or reflection mode.

In an embodiment the present paste composition includes an organopolysiloxane, such as a trimethyl-terminated PDMS, that has a number average molecular weight ($M_n$) of 5 to 150 kilodaltons (kDa), or 10 to 130 kDa, or 50 to 120 kDa, or 100 to 120 kDa. Ordinarily, organopolysiloxanes with too low a molecular weight are partially or fully dissolved in the paste composition's solvent and so do not exhibit adequate phase separation for the desired improvement in printing rheology to be achieved. Organopolysiloxanes with too high a molecular weight are themselves typically viscous, limiting the amount that can be added without rendering the final paste composition too viscous to be readily printed, so that no end-use benefit is realized. Suitable molecular weights also depend on the particular terminal group(s) present. In some embodiments, functionalized termination of the organopolysiloxane results in a lower paste viscosity and better printability than would be seen at the same loading with an un-functionalized organopolysiloxane having the same molecular weight. This, in turn, permits the loading of the organopolysiloxane and/or its molecular weight to be increased in a paste that exhibits desirable rheology.

Embodiments of the present paste composition include ones in which the amount of organopolysiloxane ranges from a lower limit of 0.05%, 0.1%, 0.2%, or 0.3% to an upper limit of 0.75%, 1%, or 2% by weight of the total paste composition.

C. Other Polymeric Materials

In addition to the foregoing microgel and organopolysiloxane polymers, the present paste composition may include one or more additional polymeric materials. Such materials include, without limitation, any one or more of the substances disclosed in U.S. Pat. No. 7,494,607 and International Patent Application Publication No. WO 2010/123967 A2, both of which are incorporated herein in their entirety for all purposes, by reference thereto. These include ethyl- and ethylhydroxyethyl-based cellulosic polymers, cellulose acetate, cellulose acetate butyrate, wood rosin and derivatives thereof, mixtures of ethyl cellulose and phenolic resins, polymethacrylates of lower alcohols, and monobutyl ether of ethylene glycol monoacetate. For example, ethylcellulose, as provided by Dow Chemical Company, Midland, Mich. in varying viscosities, such as those sold under the tradenames Ethocel™ STD 4, STD 10, and STD 200, may be used. These materials are said by their manufacturer to have an ethoxyl content of 48.0 to 49.5% and to act as rheology modifiers and binders. Also possible are Vamac® G diamine-cured terpolymer of ethylene, methylacrylate, and a cure site monomer elastomer (E. I. DuPont de Nemours and Company, Wilmington Del.); and Foralyn™ 110 pentaerythritol ester of hydrogenated rosin (Eastman Chemical, Kingsport, Tenn.). Any of the polymers above or other suitable polymers may be present in the vehicle in any effective amount.

In some possible embodiments, the organic polymer (beyond the microgel and organopolysiloxane and exclusive of solvent) can be 0.01% or 0.05% to 1, 2, 3, or 5.0% by weight of the paste composition, as long as a viscosity that permits deposition by screen printing or the like is maintained.

D. Other Vehicle Constituents

The vehicle may further comprise one or more other non-aqueous organic substances including, without limitation, surfactants, wetting agents, dispersants, thickeners, thixotropes, binders, stabilizers, or other rheology- or viscosity-adjusting agents or other common additives known to those skilled in the art. The organic vehicle may also include naturally-derived ingredients such as various plant-derived oils, saps, resins, or gums. The additional organic substances ordinarily are non-aqueous and are inert, meaning that they may be removed by a firing operation without leaving any substantial residue or producing other effects detrimental to the paste or the final conductor line properties.

Surfactants found useful in the present paste composition include, without limitation: Duomeen® TDO surfactant (Akzo Nobel Surface Chemistry, LLC, Chicago, Ill.); Tween® surfactant (Aldrich), a polyoxyethylene sorbitol ester represented by the manufacturer as having a calculated molecular weight of 1,225 Da, assuming ethylene oxide units, 1 sorbitol, and 1 lauric acid as the primary fatty acid; and sodium dodecyl sulfate (SDS). Suitable wetting agents include phosphate esters and soya lecithin.

A wide variety of inorganic and organic thixotropic agents are useful, including gels, organics, and agents derived from natural sources such as saps, resins, gums, or oils such as castor oil (possibly hydrogenated) or a derivative thereof. Such substances promote shear thinning behavior in some embodiments. Thixatrol® MAX and Thixatrol® PLUS amides (Elementis Specialties, Inc., Hightstown, N.J.) are exemplary thixotropic rheology modifiers. Other low molecular weight amides or amide-olefin oligomers may also be suitable. It is, of course, not always necessary to incorporate a thixotropic agent since the solvent and resin properties coupled with the shear thinning inherent in any suspension may alone be suitable in this regard.

E. Solvent

The vehicle of the paste composition ordinarily includes one or more solvents in which the remaining organic and inorganic substances are dispersed. The proportion of solvent is frequently adjusted at the end of production or immediately prior to use, so that the paste composition has a viscosity compatible with the desired printing or other method of application. Further beneficial effects of the solvent(s) include any one or more of: swelling and/or dispersing the microgel particles; dissolving any organic resins contained in the paste; and stabilizing a concentratedsuspension of the inorganic solids present. Ideally the solvent and other organics can be completely removed during a firing operation. Some of the solvent may be sufficiently volatile to promote rapid hardening after the thick-film paste composition is applied on a substrate.

Solvents known for use in thick film compositions include ester alcohols such as Texanol™ solvent (2,2,4-trimethyl-1,3-pentanediol monoisobutyrate); terpenes such as alpha- or beta-terpineol or mixtures thereof with other solvents such as kerosene, dibutylphthalate, butyl carbitol, butyl carbitol acetate (diethylene glycol n-butyl ether acetate), hexylene glycol, dibenzyl ether; benzyl alcohol or other higher alcohols and alcohol esters, benzyl benzoate, 2-pyrrolidone, dibasic ester (DBE), or any mixture thereof. Some embodiments incorporate volatile liquids for promoting rapid hardening after application on the substrate can be included in the vehicle. Various combinations of these and other solvents are formulated to obtain the viscosity and volatility requirements desired, along with other beneficial paste properties. The present paste composition may be adjusted as needed to a predetermined, screen-printable viscosity, e.g., by adding additional solvent(s).

In an embodiment, the vehicle may include one or more components selected from the group consisting of: bis(2-(2-butoxyethoxy)ethyl) adipate, dibasic esters, octyl epoxy tallate, isotetradecanol, and a pentaerythritol ester of hydrogenated rosin. The paste composition may also include additional additives or components.

The dibasic ester useful in the present paste composition may comprise one or more dimethyl esters selected from the group consisting of dimethyl ester of adipic acid, dimethyl ester of glutaric acid, and dimethyl ester of succinic acid. Various forms of such materials containing different proportions of the dimethyl esters are available under the DBE® trade name from Invista (Wilmington, Del.). For the present paste composition, a preferred version is sold as DBE-3 and is said by the manufacturer to contain 85 to 95 weight percent dimethyl adipate, 5 to 15 weight percent dimethyl glutarate, and 0 to 1.0 weight percent dimethyl succinate based on total weight of dibasic ester.

The solvent can be 3 to 10 wt % in an embodiment, 4 to 9 wt % in another embodiment, and 5 to 8 wt % in another embodiment, based on the weight of the conductive paste. With such amount of solvent, a conductive paste can exhibit a viscosity and other rheological properties suitable for deposition, e.g. by screen printing.

The conductive paste composition may have any viscosity that is compatible with the desired deposition process. A skilled person will recognize that the viscosity required for best printability depends on a number of factors, including, without limitation, the screen mesh used and the size of the finger lines and other structures to be printed. Frequently, the paste composition is adjusted prior to deposition by addition of a small amount of the solvent. In some implementations, a final viscosity at 25° C. of about 300±50 Pa·s or more at 10 rpm has been found convenient for screen printing fine electrode lines. In other embodiments, the viscosity at 25° C. is 100-110 Pa·s±20 Pa·s at 50 rpm. The viscosity of the conductive paste can be measured with Brookfield HBT viscometer with a utility cup using a #14 spindle or other similar apparatus, with values being taken after 3 min at 10 rpm or 50 rpm or other rotational speeds.

In some embodiments, one or more of the components of the vehicle promotes thixotropy, or shear thinning. The degree of shear thinning can be ascertained from a difference seen between viscosity measurements carried out with different rotation times and rates, e.g., by comparing values obtained at 0.5 rpm (3 min), 10 rpm (3 min), 20 rpm (3 min), and/or 50 rpm (3 min).

III. Formation of Conductive Structures

A. Substrate

An aspect of the present disclosure provides a process that may be used to form a conductive structure on a substrate. Ordinarily, the process first entails the fabrication of a precursor structure, generally comprising the steps of providing the substrate and applying a paste composition onto it in a preselected pattern suitable for producing the conductive structure in the desired final configuration. The precursor is then fired to produce the conductive structure, which is often termed a "metallization." Most commonly, the substrate is planar and relatively thin, thus defining opposing first and second major surfaces on its respective sides. The present paste composition may be used to form an electrode on one or both of these major surfaces.

B. Insulating Layer

In some embodiments, the present paste composition is used in conjunction with a substrate, such as a semiconductor substrate, having an insulating or passivation layer present on one or both of the substrate's major surfaces. The layer may comprise, without limitation, one or more components selected from aluminum oxide; titanium oxide; silicon nitride; $SiN_x$:H (silicon nitride containing hydrogen for passivation during subsequent firing processing); silicon oxide; silicon nitride, oxide, or oxynitride containing carbon; and silicon oxide/titanium oxide. There may be a single, homogeneous layer or multiple sequential sub-layers, each of which independently may be any of these materials. Silicon nitride and $SiN_x$:H are widely used. Passivation layers between 1 and 200 nm thick are suitable for typical applications.

In implementations for fabricating photovoltaic cells, the insulating layer is typically structured to provide an anti-reflective property, to lower the amount of incident light that is reflected from the cell's surface. Reducing the amount of light lost to reflection improves the cell's utilization of the incident light and increases the electrical current it can generate. Thus, the insulating layer is often denoted as an anti-reflective coating (ARC). The thickness of the layer preferably is chosen to maximize the anti-reflective property in accordance with the layer material's composition and refractive index. For example, the insulating ARC layer may have a thickness of between 1 and 200 nm. In one approach, the deposition processing conditions are adjusted to vary the stoichiometry of the layer, thereby altering properties such as the refractive index to a desired value. For a silicon nitride layer with a refractive index of about 1.9 to 2.0, a thickness of about 700 to 900 Å (70 to 90 nm) is suitable.

The insulating layer may be deposited on the substrate by methods known in the microelectronics art, such as any form of chemical vapor deposition (CVD) including plasma-enhanced CVD (PECVD) and thermal CVD, thermal oxidation, or sputtering. In another embodiment, the substrate is coated with a liquid material that under thermal treatment decomposes or reacts with the substrate to form the insulating layer. In still another embodiment, the substrate is thermally treated in the presence of an oxygen- or nitrogen-containing atmosphere to form an insulating layer. Alternatively, no insulating layer is specifically applied to the substrate, but a naturally forming substance, such as silicon oxide on a silicon wafer, may function as an insulating layer.

The present method optionally includes the step of forming the insulating layer on the semiconductor substrate prior to the application of the paste composition.

In some implementations of the present process, the paste composition is useful whether the insulating layer is specifically applied or naturally occurring. The paste's oxide and non-oxide components may act in concert to combine with, dissolve, or otherwise penetrate some or all of the thickness of any insulating layer material during firing.

C. Application

The present composition can be applied as a paste onto a preselected portion of a major surface of a semiconductor substrate in a variety of different configurations or patterns, depending on the device architecture and the particular substrate material used. The preselected portion may comprise any fraction of the total area of the major surface. The area covered may range from a small fraction up to substantially all of the area. In an embodiment, the paste is applied on a semiconductor substrate, which may be single-crystal, cast mono, multi-crystal, polycrystalline, or ribbon silicon, or any other semiconductor material.

The application can be accomplished using a variety of deposition processes, including screen printing and other exemplary deposition processes discussed above. In an embodiment, the paste composition may be applied over any insulating layer present on the pertinent major surface of the substrate.

The conductive composition may be printed in any useful pattern. For example, the application of the conductive paste may be used to form a photovoltaic cell precursor, wherein the paste is deposited on a preselected portion of a semiconductor substrate in a configuration that is appointed to be converted by a firing operation into an electrically conductive structure that includes at least one electrode in electrical contact with the substrate. In an implementation, the at least one electrode is configured to be connected to outside electrical circuitry to which electrical energy is to be supplied.

The electrode pattern used for a front side electrode of a photovoltaic cell commonly includes a plurality of narrow grid lines or fingers extending from one or more larger bus bars. Such a pattern permits the current generated in the cell to be extracted from the front side without undue resistive loss, while minimizing the area obscured by the metallization, which inherently reduces the amount of incoming light energy that can be converted to electrical energy. Ideally, the features of the electrode pattern should be well defined, with preselected and uniform thickness and shape, and provide high electrical conductivity and low contact resistance with the underlying structure. Fingers that are uniform in height and width and have a high ratio of height to width are beneficial in increasing the effective conductor cross sectional area (thus decreasing electrical resistance) while minimizing the obscured area. Thus, a paste composition ideally has rheology such that finger lines can be uniformly deposited in the initial printing without undulations or other irregularities in width or height and that further spreading or other distortion does not occur during subsequent drying or firing steps.

In an embodiment, the width of the lines of the conductive fingers may be 20 to 200 µm; 25 to 100 µm; or 25 to 50 µm. In an embodiment, the thickness of the lines of the conductive fingers may be 5 to 50 µm; 10 to 35 µm; or 10 to 25 µm.

D. Firing

A heat treatment operation often termed "firing" is used in the present process to promote the formation of a conductive structure that includes an electrode providing a high-quality electrical contact with an underlying substrate, such as a semiconductor wafer in a PV (photovoltaic) cell. A drying operation optionally precedes the firing operation, and is carried out at a modest temperature to harden the paste composition, which may comprise removing its most volatile organics. In an embodiment, the conditions of the firing operation (e.g., the temperature attained by the precursor and duration of exposure) are sufficient to form an electrode exhibiting the desired properties in its electrical contact with the associated semiconductor substrate.

The firing operation is believed to effect a substantially complete burnout of the vehicle from the deposited paste by volatilization and/or pyrolysis of the constituent vehicle materials. While the present invention is not limited by any particular theory of operation, it is believed that during a suitable firing, the fusible material acts to efficiently penetrate the insulating layer normally present on the wafer, such as a naturally-occurring or intentionally formed passivation layer and/or an anti-reflective coating. Such a result is frequently termed "firing through." The various paste components are also thought to promote sintering of the conductive metal powder, e.g. silver, that forms the electrode.

Ideally, the firing results in formation of an electrode that has good electrical properties, including a high bulk conductivity and a low surface resistivity connection to the underlying semiconductor material, thereby reducing the source impedance of the cell. While some embodiments may function with electrical contact that is limited to conductive domains dispersed within the printed area, it is preferred that the contact be uniform over substantially the entire printed area. It is also beneficial for the conductive metal structure to be mechanically robust and securely attached to the substrate, with a metallurgical bond being formed over substantially all the area of the substrate covered by the conductive element.

Such a paste would further enable screen-printed crystalline silicon solar cells to have reduced saturation current density at the front surface (J0e) and accompanying increased Voc and Jsc, and therefore improved solar cell performance. Other desirable characteristics of a paste would include high bulk conductivity and the ability to form narrow, high-aspect-ratio contact lines in a metallization pattern to further reduce series resistance and minimize shading of incident light by the electrodes, as well as good adherence to the substrate. A high shunt resistance is also desired, indicating that the firing did not adversely affect the semiconductor's properties.

In one embodiment, the set point temperature of the oven or furnace for the firing may be in the range between about 300° C. and about 1000° C., or between about 300° C. and about 525° C., or between about 300° C. and about 650° C., or between about 650° C. and about 950° C. The firing may be conducted using any suitable heat source, and may be performed in an atmosphere composed of air, nitrogen, an inert gas, or an oxygen-containing mixture such as a mixed gas of oxygen and nitrogen.

In an embodiment, the firing is accomplished using a belt furnace. The substrate bearing the printed paste composition pattern is placed on a belt that is conveyed through the furnace's hot zone at high transport rates, for example between about 100 to about 500 cm per minute, with resulting hold-up times between about 0.05 to about 5 minutes. Multiple temperature zones may be used to control the desired thermal profile in the furnace, and the number of zones may vary, for example, between 3 to 11 zones. The temperature of a firing operation conducted using a belt furnace is conventionally specified by the furnace set point in the hottest zone of the furnace, but it is known that the highest temperature actually attained by the passing substrate in such a process is somewhat lower than the highest set point. Other batch and continuous rapid fire furnace designs known to one of skill in the art are also contemplated.

E. Semiconductor Device Manufacture

An embodiment of the present disclosure relates to a device structure comprising a substrate and a conductive electrode, which may be formed by the process described above.

Conductive structures as provided herein may be usefully employed in a wide range of electrical, electronic, and semiconductor devices. Without limitation, such devices include photodiodes, photovoltaic cells, and solar panels or other like articles, in which one or more conductive structures function as electrodes through which the device can be connected to other electrical circuitry. Devices that are individually or collectively fabricated using processes disclosed herein may be incorporated into larger structures, such as a solar panel including a plurality of interconnected photovoltaic cells. Ordinarily, precursors formed using the process disclosed herein or any other suitable process are converted into finished semiconductor devices using a firing operation that converts the deposited paste composition into a suitably configured conductive structure that provides electrodes in electrical communication with the semiconductor, as described herein.

One possible sequence of steps implementing the present process for manufacture of a photovoltaic cell device is depicted by FIGS. 1A-1F. While the process is described with reference to a conventional p-base cell having a planar architecture, comparable steps useful in fabricating planar n-base cells or cells having other architectures such as interdigitated back contact cells will also be apparent.

FIG. 1A shows a p-type substrate 10, which may be any known type of Si including, without limitation, single-crystal, multi-crystalline, mono-crystalline, or polycrystalline silicon. For example, substrate 10 may be obtained by slicing a thin wafer from an ingot that has been formed from a pulling or casting process. In an implementation, the Si ingot is doped with B to render it p-type. Surface damage and contamination (from slicing with a wire saw, for example) may be removed by etching away about 10 to 20 μm of the substrate surface using an aqueous alkali solution such as aqueous potassium hydroxide or aqueous sodium hydroxide, or using a mixture of hydrofluoric acid and nitric acid. In addition, the substrate may be washed with a mixture of hydrochloric acid and optional hydrogen peroxide to remove heavy metals such as iron adhering to the substrate surface. Although not specifically depicted, substrate 10 may have a first major surface 12 that is textured to reduce light reflection. Texturing may be produced by etching a major surface with an aqueous alkali solution such as aqueous potassium hydroxide or aqueous sodium hydroxide. Substrate 10 may also be formed from a silicon ribbon.

Figure 1B:
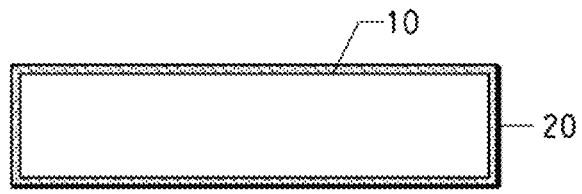

In FIG. 1B, an n-type diffusion layer 20 is formed on the first major surface 12 to create a p-n junction with p-type material below. The n-type diffusion layer 20 can be formed by any suitable doping process, such as thermal diffusion of phosphorus (P) provided from phosphorus oxychloride ($POCl_3$) or ion implantation. The profile of dopant concentration versus depth from the surface depends on the amount of material deposited and the thermal or implantation conditions used. As shown, the n-type diffusion layer 20 is formed over the entire surface of the silicon p-type substrate. In other implementations, the diffusion layer is confined to the top major surface, obviating the need for the removal process. The depth of the diffusion layer can be varied by controlling the diffusion temperature and time, and is generally formed in a thickness range of about 0.3 to 0.5 μm. The n-type diffusion layer may have a sheet resistivity ranging from several tens of ohms per square up to about 120 ohms per square. In some alternative implementations (not shown), additional doping with B at a level above that of the bulk is added in a layer on opposing second (rear) major surface 14.

Figure 1C:
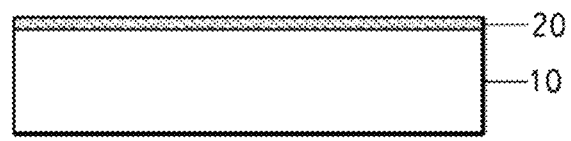

After protecting one surface of the n-type diffusion layer 20 with a resist or the like, the n-type diffusion layer 20 is removed from most surfaces by etching so that it remains only on the first major surface 12 of substrate 10, as shown in FIG. 1C. The resist is then removed using an organic solvent or the like.

Figure 1D:
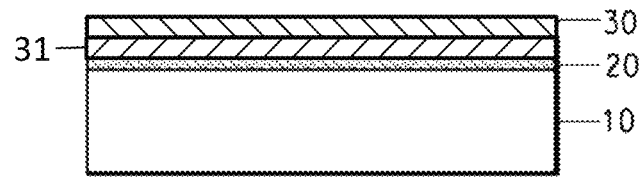

Next, as shown in FIG. 1D, an insulating layer 30, which also functions as an anti-reflective coating, is formed on the n-type diffusion layer 20. The insulating layer is commonly silicon nitride, but can also be a layer of another material, such as $SiN_x$:H (i.e., the insulating layer comprises hydrogen for passivation during subsequent firing processing), titanium oxide, silicon oxide, mixed silicon oxide/titanium oxide, aluminum oxide, or another suitable insulating material. The insulating layer can be in the form of a single layer or multiple layers of the same or different materials. In some embodiments, the production of the diffusion layer shown in FIG. 1B includes a thermal treatment in air that may result in the formation of some amount of silicon dioxide on the substrate surface (not shown).

Figure 1E:
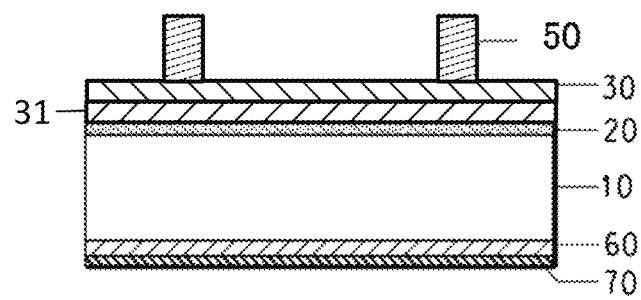

Next, electrodes are formed on both major surfaces 12 and 14 of the substrate. As shown in FIG. 1E, a paste composition 90 as provided herein is screen printed atop insulating layer 30 of the first major surface 12 and then dried. For a photovoltaic cell, paste composition 90 is typically applied in a predetermined pattern of conductive lines extending perpendicularly from one or more bus bars that occupy a predetermined portion of the surface. In addition, aluminum paste 60 and back-side silver paste 70 are screen printed onto the back side (the second major surface 14 of the substrate) and successively dried. The screen printing operations may be carried out in any order. For the sake of production efficiency, all these pastes are typically processed by co-firing them, typically at a temperature in the range of about 700° C. to about 975° C. for a period of from several seconds to several tens of minutes in air or an oxygen-containing atmosphere. An infrared-heated belt furnace is conveniently used for high throughput.

Figure 1F:
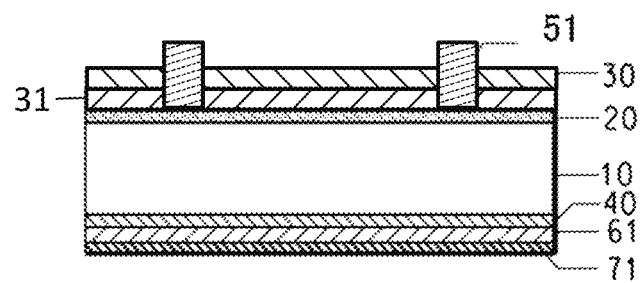

As shown in FIG. 1F, the firing is carried out under conditions of time and temperature exposure that are sufficient to cause the depicted paste composition 90 on the front side to sinter and penetrate through the insulating layer 30, as well as any silicon dioxide thermally produced in the n-layer diffusion step described above, thereby achieving electrical contact with the n-type diffusion layer 20, a condition known as "fire through." This fired-through state, i.e., the extent to which the paste reacts with and passes through the insulating layer 30, depends on the quality and thickness of the insulating layer 30, the composition of the paste, and on the firing conditions. A high-quality fired-through state is believed to be an important factor in obtaining high conversion efficiency in a photovoltaic cell. Firing thus converts paste 90 into electrode 91, as shown in FIG. 1F.

The firing further causes aluminum to diffuse from the back-side aluminum paste 60 into the silicon substrate, thereby forming a p+ layer 40, containing a high concentration of aluminum dopant. This layer is generally called the back surface field (BSF) layer, and helps to improve the energy conversion efficiency of the solar cell. Firing converts the dried aluminum paste 60 to an aluminum back electrode 61. The back-side silver paste 70 is fired at the same time, becoming a silver or silver/aluminum back electrode 71. It is believed that during firing, the boundary between the back-side aluminum and the back-side silver assumes the state of an alloy, thereby achieving electrical connection. Most areas of the back electrode are occupied by the aluminum electrode, owing in part to the need to form a p+ layer 40. Since there is no need for incoming light to penetrate the back side, substantially the entire surface may be covered. At the same time, because soldering to an aluminum electrode is unfeasible, silver or silver/aluminum back electrode 71 is formed on the back side as an electrode to permit soldered attachment of interconnecting copper ribbons or the like. Although silver paste 70 is depicted as covering the same area as aluminum paste 60, it is sufficient for electrode 71 to cover a limited area that still accommodates this solder attachment.

A semiconductor device fabricated as described above may be incorporated into a photovoltaic cell. In another embodiment, a photovoltaic cell array includes a plurality of the aforementioned semiconductor devices as described. The devices of the array may be made using a process described herein.

It will be apparent that similar processes can be used to fabricate conductive structures in photovoltaic cells having other architectures or other electrical, electronic, and semiconductor devices, all of which are contemplated within the scope of the present disclosure.

EXAMPLES

The operation and effects of certain embodiments of the present invention may be more fully appreciated from a series of examples (Examples 1-11) described below, and comparison of those examples with Comparative Examples 1-3. The embodiments on which these examples are based are representative only, and the selection of those embodiments to illustrate aspects of the invention does not indicate that materials, components, reactants, conditions, techniques and/or configurations not described in the examples are not suitable for use herein, or that subject matter not described in the examples is excluded from the scope of the appended claims and equivalents thereof.

Ingredients

Ingredients useful in preparing the present paste composition include the following. Unless otherwise stated, these ingredients are used in preparing the Examples below.

Glass Frit:

Glass frits A, B, and C are all Pb—Te—O containing glasses having a $d_{50}$ value of 0.5-0.7 μm.

Frit Additive:

Lithium ruthenate (LiRuO$_3$), synthesized as described in U.S. Pat. No. 8,808,581 cited herein.

Silver Powder

The Ag powders used in the exemplary paste compositions below are finely divided and have a predominantly spherical shape, with particle size distributions having the listed $d_{50}$ values as measured in an isopropyl alcohol dispersion using a Horiba LA-910 analyzer:

Ag-A: $d_{50}$~1.8-2.0 μm;
Ag-B: $d_{50}$~1.2 μm;
Ag-C: $d_{50}$~1.8-2.0 μm.

(Meth)Acrylate Monomers:
MMA: methyl methacrylate (Aldrich)
BMA: n-butyl methacrylate (Aldrich)
UMA: 25 wt % 2-(2-Oxo-1-imidazolidinyl)ethyl methacrylate in MMA (Aldrich)

Crosslinker:
EGDMA: ethylene glycol dimethacrylate (Aldrich)

Organopolysiloxane:
DMS-T46: polydimethylsiloxane, trimethylsiloxy terminated (Viscosity~60,000 cSt, Gelest, Inc., Morrisville, Pa.)

Other Polymers:
Ethocel® STD 4, 10, and 200 are ethylcellulose-based polymers (Dow Chemical Company, Midland, Mich.), said by manufacturer to have ethoxyl content of 58.0 to 49.5% and to act as rheology modifiers and binders.

Solvents:
TEX: Texanol™ ester alcohol solvent (2,2,4-trimethyl-1,3-pentadiol monoisobutyrate) (Eastman Chemical Co., Kingsport, Tenn.)

BCA: Butyl CARBITOL™ solvent (diethylene glycol n-butyl ether acetate) (Dow Chemical Company, Midland, Mich.)

DBC: diethylene glycol dibutyl ether solvent (Aldrich)

Other Organics:
Thixatrol® MAX amide thixotrope rheology modifier (Elementis Specialties, Inc., Hightstown, N.J.)

Thixatrol® PLUS amide thixotrope rheology modifier (Elementis Specialties, Inc., Hightstown, N.J.)

Duomeen® TDO surfactant (Akzo Nobel Surface Chemistry, LLC, Chicago, Ill.)

Brij™ L4: Surfactant (Croda, Inc., New Castle, Del.), polyethylene glycol dodecyl ether, said to be a non-ionic surfactant having $M_n$ ~362 Da.

Examples EX-1 to EX-8

Comparative Examples CE-1 to CE-3

Preparation of Conductive Paste Compositions Containing Polymers and Microgels

The conductive paste compositions of Examples EX-1 to EX-8 and Comparative Examples CE-1 to CE-3 are prepared in the following general manner.

Table I lists as Preparations P1-P4 the ethylcellulose and microgel solutions and dispersions used in the Examples and Comparative Examples, along with the respective types and amounts of solvents used. Solutions P1-P3 are prepared with ethylcellulose material obtainable from Dow Chemical Company, Midland, Mich. in varying viscosities under the tradenames Ethocel™ STD 4, STD 10, and STD 200. The ethylcellulose resin is pre-dispersed in solvent at the indicated concentration by heating to a slightly elevated temperature with stirring and then cooling to room temperature. The microgel dispersion (P4) is prepared using emulsion polymerization techniques, as described above and in commonly owned U.S. patent application Ser. No. 15/015,245, which was filed Feb. 4, 2016, and is incorporated herein in its entirety for all purposes by reference thereto. The P4 dispersion comprises MMA, BMA, and UMA methacrylates and EGDMA as the cross linker.

Table I

Polymer and Microgel Preparations

TABLE I

| Preparation | Polymer/Microgel | Crosslinker Level (%) | Amount (g) | Solvent | Amount (g) |
|---|---|---|---|---|---|
| P1 | Ethocel ® STD 4 | — | 20 | BCA | 180 |
| P2 | Ethocel ® STD 10 | — | 20 | BCA | 180 |
| P3 | Ethocel ® STD 200 | — | 20 | BCA | 180 |
| P4 | BMA(47.5)/MMA(47.5)/UMA(5)* | 0.25 | 28 | BCA:TEX 1:1 | 172 |

*Percentages of the acrylates by weight.

The requisite amounts (g) of polymer solution/dispersion, solvent, thixotrope, and surfactant indicated for each example in Table II are weighed, then mixed to form the vehicle. The inorganic solids, i.e. glass frit, silver powder, and frit additive in the indicated amounts, are added and further mixed in the mixer to form a paste composition. The glass frit used is a Pb—Te—O based frit, but other leaded and lead-free frits might also be used. Since the silver powder is the major part of the solids of the paste composition, it is ordinarily added incrementally, with mixing after each addition to ensure better wetting. Each of the foregoing mixing steps might be carried out in a planetary, centrifugal mixer. For example, a Thinky® mixer (available from Thinky® USA, Inc., Laguna Hills, Calif.) operated at 2000 rpm for 30 s would be suitable. After the final addition, the paste is cooled and the viscosity is adjusted to between about 300 and 400 Pa-s by mixing in a small amount of added solvent. The paste composition is then repeatedly passed through a three-roll mill with a 25 μm gap at pressures that are progressively increased from 0 to 400 psi (~2.8 MPa). A suitable mill is available from Charles Ross and Son, Hauppauge, N.Y. If more than one type of silver powder is to be used in the recipe, the silver with the smaller d50 is preferably incorporated first. This sample is then roll milled before the silver powder(s) with larger d50 is incorporated. After the second silver powder is added, the final paste composition is milled again with the same mill parameters.

Each paste composition is allowed to sit for at least 16 hours after roll milling, and then its viscosity is adjusted with additional TEXANOL™ solvent to render it suitable for screen printing. Viscosity is conveniently measured using a Brookfield viscometer (Brookfield Inc., Middleboro, Mass.) with a #14 spindle and a #6 cup. Viscosity values may be taken after 3 minutes at 50 rpm. Ordinarily, the paste composition is again adjusted just prior to printing by adding a small amount of solvent as required to obtain a viscosity suitable for screen printing fine lines. Typically, a viscosity of about 100-110 Pa-s at 50 rpm is found to yield good results for printing with screens such as those described herein, but some variation, for example ±20 Pa-s or more, would be acceptable, depending on the precise printing apparatus and parameters.

The degree of dispersion of each paste composition may be measured using commercial fineness of grind (FOG) gages (e.g., gages available from Precision Gage and Tool, Dayton, Ohio) in accordance with ASTM Standard Test Method D 1210-05, which is promulgated by ASTM International, West Conshohocken, Pa., and is incorporated herein by reference. The resulting data are ordinarily expressed as FOG values represented as X/Y, meaning that the size of the largest particle detected is X μm and the median size is Y μm. In an embodiment, the FOG values of the present paste compositions are typically 20/10 or less, which typically has been found to be sufficient for good printability.

The foregoing process is determined to produce paste composition material that is sufficiently homogenous to achieve reproducible solar cell performance.

TABLE II

Paste Composition Formulations

| Ingredient | CE-1 | CE-2 | CE-3 | EX-1 | EX-2 | EX-3 | EX-4 | EX-5 | EX-6 | EX-7 | EX-8 |
|---|---|---|---|---|---|---|---|---|---|---|---|
| P1 | 1.35 | 1.35 | | 0.63 | 0.55 | 1.10 | | 0.53 | 0.55 | 0.45 | 0.45 |
| P2 | 1.35 | 1.35 | | | | | | | | | |
| P3 | | | | 0.63 | 0.55 | | | 0.53 | 0.55 | 0.45 | 0.45 |
| P4 | | | 4.64 | 2.68 | 2.30 | 2.30 | 4.30 | 2.30 | 2.30 | 2.00 | 2.00 |
| PDMS, Mn~116k | 0.45 | 0.45 | | 0.45 | 0.45 | 0.45 | 0.45 | 0.45 | 0.45 | 0.45 | 0.45 |
| Duomeen ® TDO Surfactant | 0.15 | 0.15 | 0.5 | | | | | 0.20 | | | |
| Brij L4 | 0.15 | 0.15 | | 0.10 | 0.10 | 0.10 | 0.10 | 0.20 | 0.10 | 0.09 | 0.09 |
| Thixatrol ® Max | 0.40 | 0.40 | | 0.40 | 0.36 | 0.35 | 0.35 | 0.35 | | 0.31 | 0.31 |
| Thixatrol ® Plus | | | 0.55 | | | | | | 0.36 | | |
| Solvent(s) | 5.12 | 5.12 | 2.9 | 4.1 | 3.75 | 3.50 | 2.5 | 3.5 | 3.85 | 3.45 | 3.50 |
| Frit Additive | | 0.04 | 0.07 | | | | | | | | |
| Glass Frit A | 1.8 | 1.8 | | 1.8 | 1.8 | 1.8 | 1.8 | 1.8 | 1.8 | 1.8 | 1.8 |
| Glass Frit B | | 0.2 | | | | | | | | | |
| Glass Frit C | | | 1.5 | | | | | | | | |
| Ag-A | 89.24 | 89.00 | 89.85 | 89.51 | 45.32 | 45.40 | 45.35 | 45.32 | 45.32 | | |
| Ag-B | | | | | 45.32 | 45.40 | 45.35 | 45.32 | 45.32 | | 91.7 |
| Ag-C | | | | | | | | | | 91.7 | |

TABLE II-continued

Paste Composition Formulations

| Ingredient | CE-1 | CE-2 | CE-3 | EX-1 | EX-2 | EX-3 | EX-4 | EX-5 | EX-6 | EX-7 | EX-8 |
|---|---|---|---|---|---|---|---|---|---|---|---|
| Formulated Solids (%) | 91.0 | 91.0 | 91.4 | 91.0 | 91.9 | 92.2 | 92.3 | 91.9 | 91.8 | 92.8 | 92.8 |
| Viscosity @50 rpm/3 min (Pa · s) | 85 | 85 | 90 | 93 | 112 | 114 | 106 | 108 | 119 | 102 | 122 |

Example 9

Line Dimension Characterization

The paste compositions of Examples EX-1 to EX-8 and Comparative Examples CE-1 to CE-3 are screen printed on six inch square multicrystalline p-type silicon wafers with an n-type emitter layer and a SiN antireflective layer to provide solar cell precursors having front-side conductive structures. Screens that may be used for the printing include Murakami types 360.16 and 325.16. (The "360.16" and "325.16" designations indicate that the screen mesh has 360 or 325 openings per lineal inch and the screen wire diameter is 16 μm.) Both screens may have a 20 μm mesh thickness to produce a 15 μm emulsion thickness in a comb-like arrangement of a plurality of finger lines that extend from four bus bars. The 360.16 and 325.16 screens have 101 and 111 finger lines that are 40 μm and 32 μm wide, respectively The back-side electrodes are formed by screen printing RuXing 8252X aluminum-based metallization paste to produce a full-plane Al—Si eutectic back contact upon firing.

The printed paste composition is then dried, either in a forced-air convection oven at 150° C. for 10 min or by passing the as-printed wafers through a multizone belt furnace having a peak temperature set point of 350° C. After drying, the wafers are fired by passing them through a multizone belt furnace having a peak temperature set point of 885° C. to 930° C. in the hottest zone. This heating causes the organic constituents of the paste composition to be pyrolized, or otherwise removed, and further causes the silver powder to sinter and adhere to the underlying silicon substrate, thereby producing a finished conductive structure.

Line dimensions in the finger portion of the conductive structure are determined with a LaserTec H1200 Confocal microscope. A step and repeat program is used to obtain 30 individual measurements of printed finger dimensions across the area of the wafers. An overall average is calculated from these measurements to obtain an average line dimension for each particular test condition. Line dimensions of the fingers (height and width) are obtained on as-printed wafers, after the paste drying step, and after the firing step. Line height is measured from the surface of the wafer to the peak height of the line at the measurement point. An average height is then determined from the individual measurements. The line dimensions as thus measured are set forth in Table III for the wafers of Example EX-6 and Comparative Example CE-1.

TABLE III

Line Dimension Characterization

| Property | CE-1 | EX-6 | EX-6 |
|---|---|---|---|
| Screen Information | 360.16-40 μm * 101 | 360.16-40 μm * 101 | 325.16-32 μm * 111 |
| Viscosity (50 rpm/3 min, Pa · s) | 85 | 119 | 119 |
| Fired peak height (μm) | 14.1 | 15.4 | 15.5 |
| Dried width (μm) | 45.3 | 43.7 | 38.0 |
| Fired width (μm) | 49.4 | 48.9 | 47.7 |
| Aspect ratio | 0.29 | 0.31 | 0.32 |

The paste of Example EX-6, when printed using a screen having 101 line openings 40 μm wide, produces fingers that after firing show higher line peak height, narrower line width, and thus higher line aspect ratio (height over width), than fingers prepared in the same manner with Comparative Example CE-1 paste. In addition, when printed using a screen containing 111 narrower, 32 μm wide line openings, the Example EX-6 paste is capable of printing even narrower, continuous lines with higher aspect ratio.

Example 10

Solar Cell Efficiency Characterization

The electrical performance of solar cells employing front-side electrodes fabricated as described in Example 9 is provided. Measurements of light conversion efficiencies are characterized using a suitable test apparatus, such as a Berger Photovoltaic Cell Tester. The Xe Arc lamp in the tester simulates sunlight with a known intensity of 1 sun and irradiates the front surface of the cell. The tester uses a four contact method to measure current (I) and voltage (V) at approximately 400 load resistance settings to determine the cell's I-V curve. Light energy conversion efficiency (Eff), fill factor (FF), and series resistance ($R_s$) are obtained from the I-V curve for each cell.

For each paste composition and condition, a set of 15-20 test cells is fired at a conventional peak set point temperature. The experiment is repeated to ensure that reproducible results are obtained. Table IV provides electrical data for each set averaged over the test sample. Data are shown for cells prepared using the paste compositions of Example EX-6 and Comparative Example CE-1.

TABLE IV

Solar Cell Electrical Properties

| Property | CE-1 | EX-6 | EX-6 |
|---|---|---|---|
| Screen Information | 360.16-40 μm * 101 | 360.16-40 μm * 101 | 325.16-32 μm * 111 |
| Efficiency (%) | 17.87 | 17.93 | 18.07 |
| Isc (A) | 8.794 | 8.809 | 8.849 |
| Fill Factor (%) | 78.64 | 78.85 | 78.89 |
| Voc (V) | 0.6288 | 0.6285 | 0.6297 |
| Rs (mΩ) | 1.84 | 1.82 | 1.89 |

The data of Table IV demonstrate that cells having electrodes prepared with the Example EX-6 paste show desirably higher short circuit current (Isc), fill factor, and efficiency than cells having electrodes printed using the same screen (40 μm finger line width), but with Comparative Example CE-1 paste. Even better electrical properties are seen in cells with electrodes printed with Example EX-6 paste through a screen with 32 μm finger line width. Even though the resulting lines are narrower and thus have lower cross-sectional area (see third column of Table III), the resulting cells still exhibit higher Isc and efficiency than cells with wider lines made with Comparative Example CE-1 paste.

Example 11

Line Printability Characterization and Line Resistance Measurements

Figure 2:
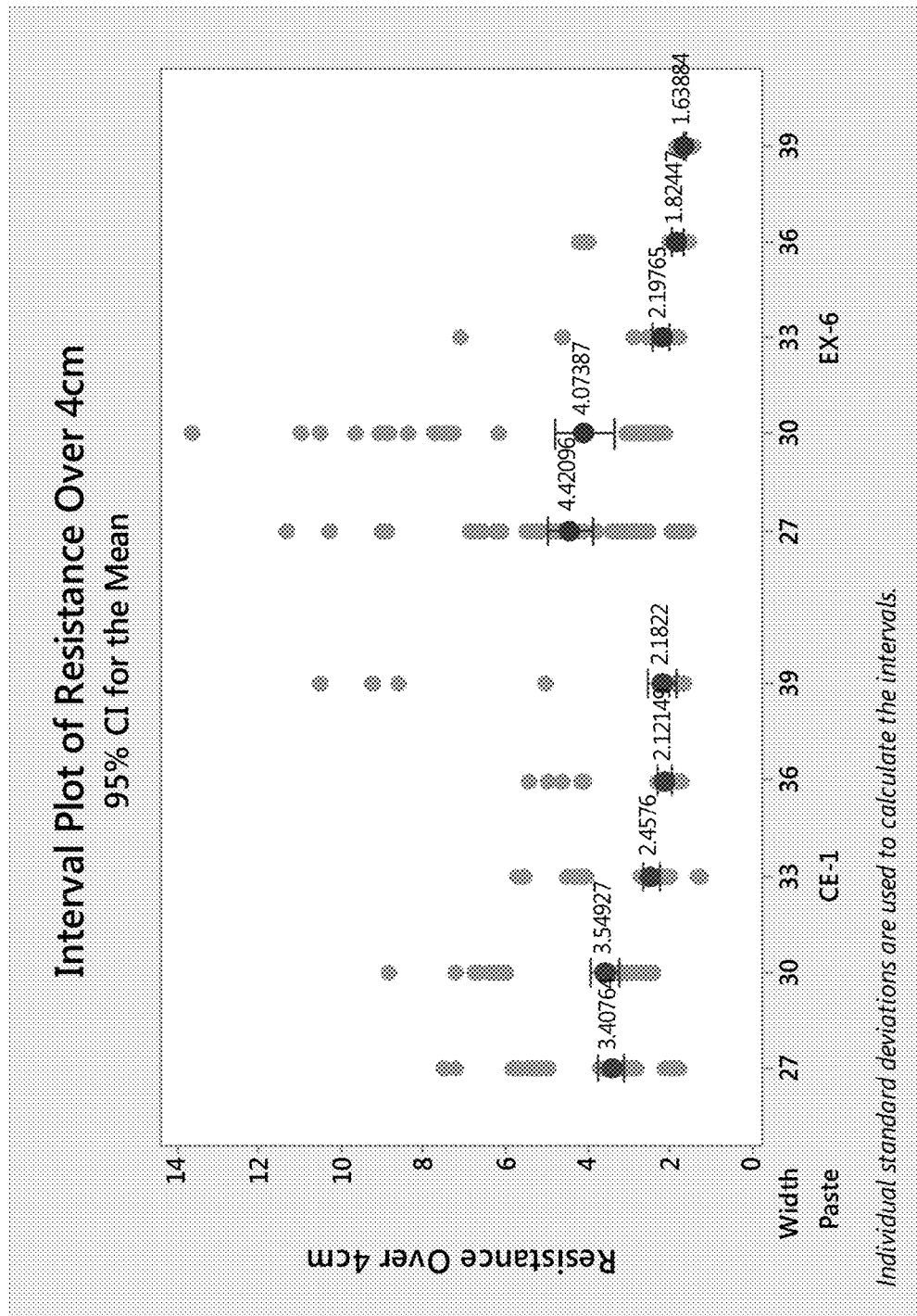
FIG. 2 provides an interval plot of line resistance data for fine conductor lines printed using a prior art paste composition and a paste composition of the present disclosure.
Figure 3:
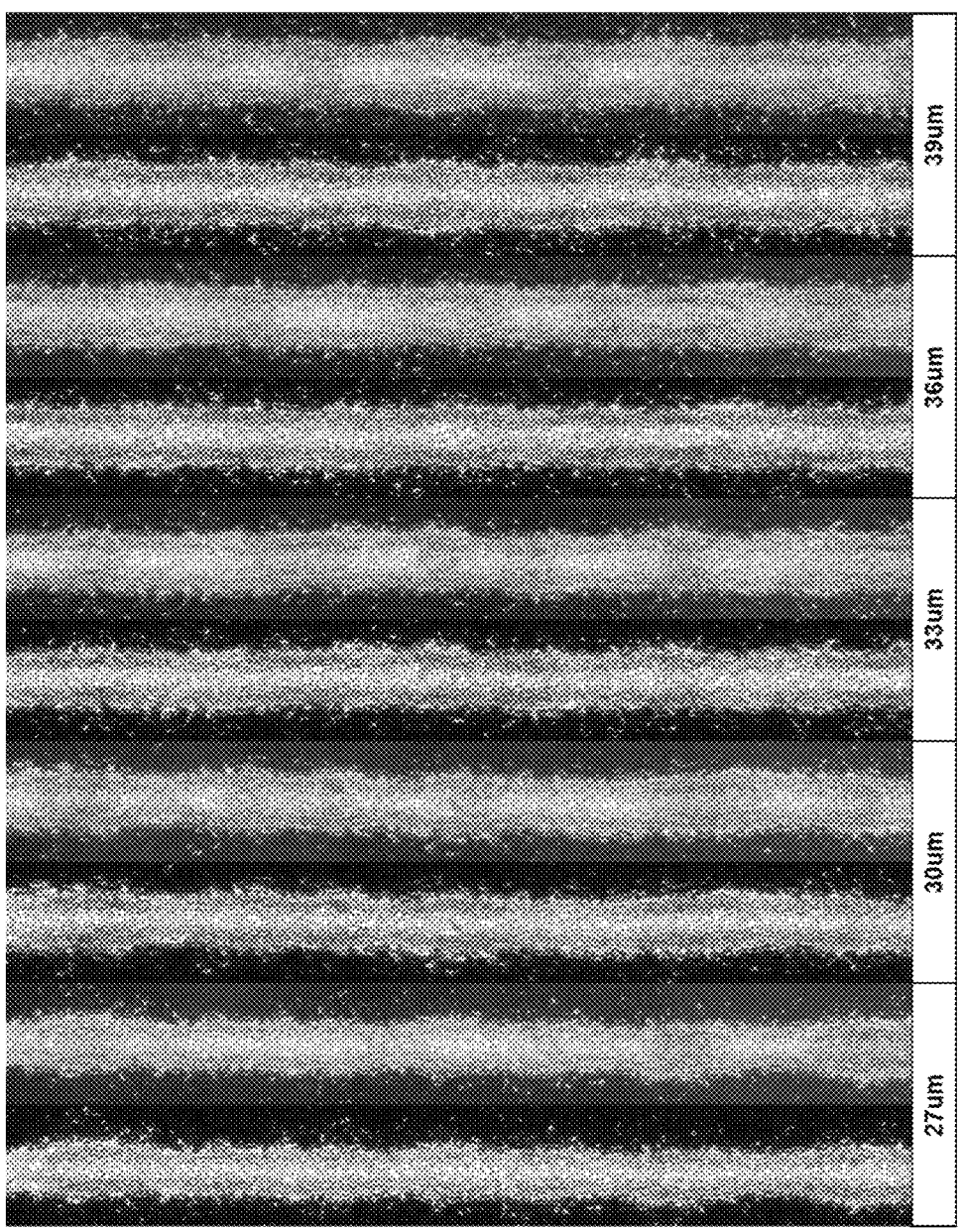
FIGS. 3-4 are optical micrographs of fired fine conductor lines respectively made with a prior art paste composition and a paste composition of the present disclosure.
Figure 4:
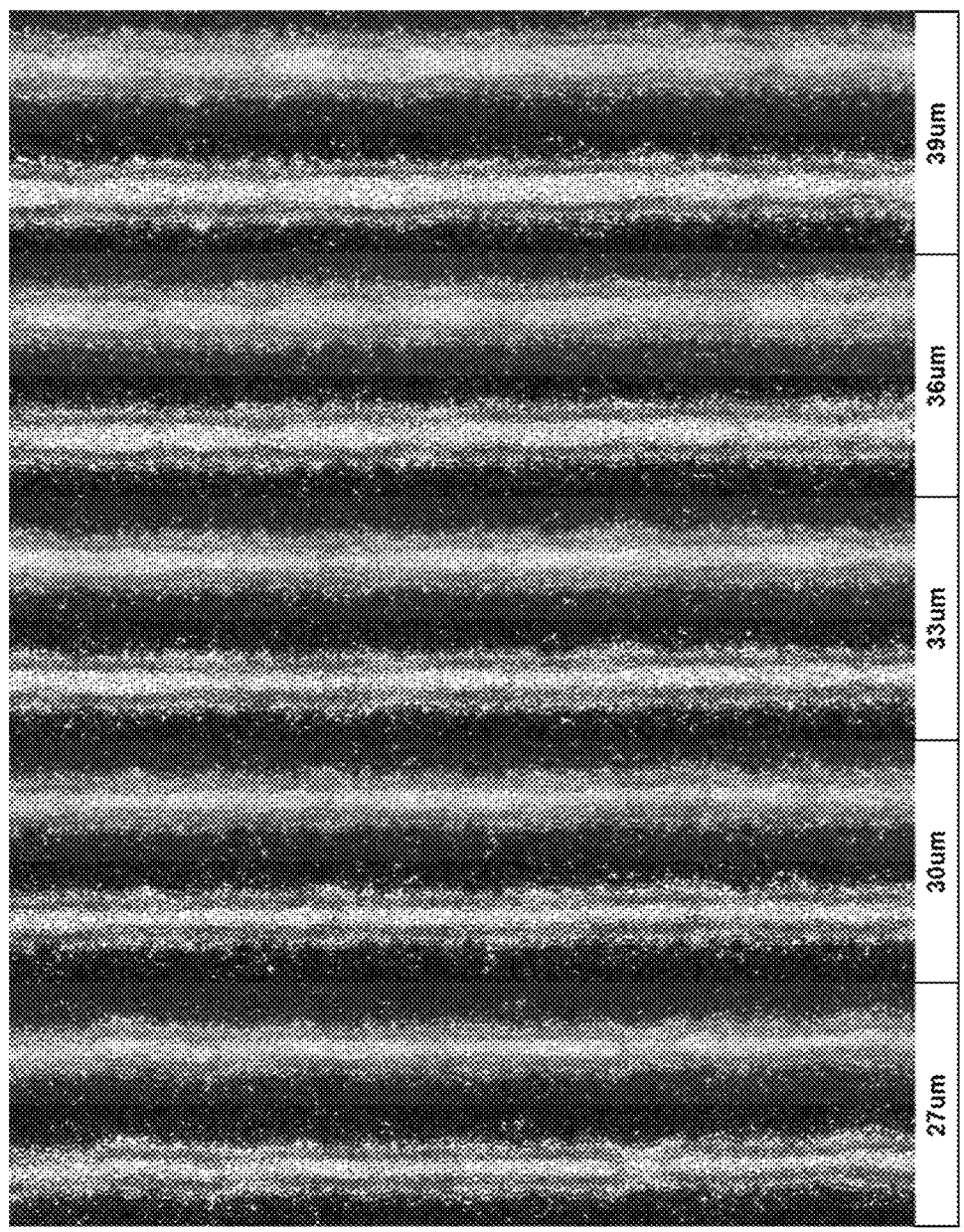

The ability of the present paste compositions to resolve fine lines is determined by printing using a Murakami 360.16 variable width screen with a 15 μm emulsion thickness and a plurality of fingers whose widths range from 39 to 27 μm in 3 μm intervals. The variable width design is repeated 7 times across the area of a 3 inch (~78 mm) square pattern. Pastes are printed and fired according to the methods described above. The integrity of the fired lines at each linewidth is judged using both optical micrographs of the lines and line resistance measurements (using a four-point probe technique). Pastes are deemed capable of resolving fine lines if the fired 33 or 36 μm lines in the variable width pattern are resolved as determined by visual inspection of the microscope images, and the resistance of the fired lines along a 4 cm gage distance is relatively low and consistent among multiple data points. Line printability results for lines made with Example EX-6 and Comparative Example CE-1 pastes at the indicated line widths are detailed in Table V and FIGS. 2-4. FIG. 2 presents an interval plot of the line resistance data, with the mean and standard deviation data summarized in Table V; FIGS. 3-4 show optical micrographs of the fired lines. From both the micrographs and measured line width data, it is apparent that the paste composition of Example EX-6 results in narrower printed lines than does the composition of Comparative Example CE-1. The average line resistances over 4 cm for fingers printed with the Example EX-6 paste through the 33 μm, 36 μm, and 39 μm line openings are beneficially lower than for similar fingers made with Comparative Example CE-1 paste, indicating that these lines are more continuous and have good cross-sectional area for current to pass. The standard deviations of measured resistance for these lines are also lower, likewise demonstrating better printing consistency. The average line resistance over 4 cm for the 27 μm and 30 μm line openings for EX-6 are higher because of line disconnects as compared to CE-1, for which line spreading results in much wider fired lines.

TABLE V

Fine Line Printability at Different Screen Openings

| Paste | Line Opening (μm) | Measured Line Width (μm) | Average Line Resistance Over 4 cm (Ω) | Standard Deviation (N = 72) |
|---|---|---|---|---|
| CE-1 | 27 | 37.6 | 3.41 | 1.36 |
|  | 30 | 38.2 | 3.55 | 1.49 |
|  | 33 | 39.1 | 2.46 | 0.87 |

TABLE V-continued

Fine Line Printability at Different Screen Openings

| Paste | Line Opening (μm) | Measured Line Width (μm) | Average Line Resistance Over 4 cm (Ω) | Standard Deviation (N = 72) |
|---|---|---|---|---|
|  | 36 | 41.2 | 2.12 | 0.72 |
|  | 39 | 41.9 | 2.18 | 1.59 |
| EX-6 | 27 | 31.6 | 4.42 | 2.09 |
|  | 30 | 33.5 | 4.07 | 2.81 |
|  | 33 | 35.5 | 2.20 | 0.76 |
|  | 36 | 37.4 | 1.82 | 0.53 |
|  | 39 | 40.7 | 1.64 | 0.08 |

Having thus described the invention in rather full detail, it will be understood that this detail need not be strictly adhered to but that further changes and modifications may suggest themselves to one skilled in the art, all falling within the scope of the invention as defined by the subjoined claims.

For example, a skilled person would recognize that the choice of raw materials could unintentionally include impurities that may be incorporated into the oxide composition or other paste constituents during processing. These incidental impurities may be present in the range of hundreds to thousands of parts per million. Impurities commonly occurring in industrial materials used herein are known to one of ordinary skill.

The presence of the impurities would not substantially alter the chemical and rheological properties of the oxide component, the fusible materials therein, paste compositions made with the oxide, or the electrical properties of a fired device manufactured using the paste composition. For example, a solar cell employing a conductive structure made using the present paste composition may have the efficiency and other electrical properties described herein, even if the paste composition includes impurities.

Where a range of numerical values is recited or established herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, where an embodiment of the subject matter hereof is stated or described as comprising, including, containing, having, being composed of, or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present. Additionally, the term "comprising" is intended to include examples encompassed by the terms "consisting essentially of" and "consisting of." Similarly, the term "consisting essentially of" is intended to include examples encompassed by the term "consisting of."

When an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In this specification, unless explicitly stated otherwise or indicated to the contrary by the context of usage, amounts, sizes, ranges, formulations, parameters, and other quantities and characteristics recited herein, particularly when modified by the term "about," may but need not be exact, and may also be approximate and/or larger or smaller (as desired) than stated, reflecting tolerances, conversion factors, rounding off, measurement error, and the like, as well as the inclusion within a stated value of those values outside it that have, within the context of this invention, functional and/or operable equivalence to the stated value.

What is claimed is:

1. A paste composition, comprising:
   an inorganic solids portion that comprises:
   (a) a source of electrically conductive metal, and
   (b) an inorganic oxide-based component, and
   a vehicle in which the constituents of the inorganic solids portion are dispersed, the vehicle comprising:
   (c) microgel particles;
   (d) organopolysiloxane having a number average molecular weight (Mn) of at least 5 kilodaltons; and
   (e) a solvent,
   and wherein the organopolysiloxane is phase-segregated in the vehicle.

2. The paste composition of claim 1, wherein the microgel particles comprise polymer units polymerized from one or more acrylate or methacrylate monomers or a mixture thereof.

3. The paste composition of claim 2, wherein the one or more monomers comprise one or more of ethyl acrylate, methyl acrylate, methyl methacrylate, n-butyl methacrylate, iso-butyl methacrylate, benzyl methacrylate, styrene, or 2-(2-Oxo-1-imidazolidinyl)ethyl methacrylate, or a mixture thereof in any proportion.

4. The paste composition of claim 3, wherein the monomers comprise one or more of methyl methacrylate, n-butyl methacrylate, or 2-(2-Oxo-1-imidazolidinyl)ethyl methacrylate, or a mixture thereof in any proportion.

5. The paste composition of claim 1, wherein the organopolysiloxane comprises a polymer having a structure represented by Formula (II)

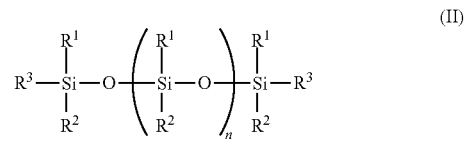

or a copolymer having a structure represented by Formula (III),

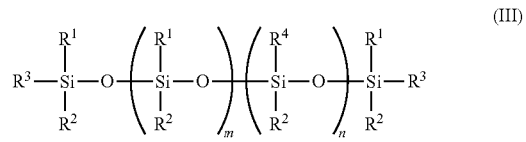

in which each of the $R^1$, $R^2$, $R^3$, and $R^4$ groups is independently selected from C1-C8 alkyl, C2-C8 alkenyl, C2-C8 alkynyl, or C6-C10 aryl groups, with any of the $R^1$, $R^2$, $R^3$, and $R^4$ groups optionally comprising one or more substituents selected from alkoxy, hydroxyl, carbonyl, carboxyl, amino, epoxy, methacrylic, glycioxy, ureido, sulfide, methacryloxy, sulfhydryl, and halogen groups, and with the proviso that the $R^1$ and $R^4$ groups are different; and m and n are integers, each of which may range independently from 50 to 100,000.

6. The paste composition of claim 1, wherein the microgel particles comprise a crosslinker that is at least one of ethylene glycol dimethacrylate, 1,4-butanediol dimethacrylate, poly(ethylene glycol) dimethacrylate, glycerol dimethacrylate, glycerol trimethacrylate, diethyleneglycol dimethacrylate, triethyleneglycol dimethacrylate, trimethylolpropane trimethacrylate, or any mixture thereof.

7. The paste composition of claim 6, wherein the crosslinker is present in an amount ranging from a lower limit of 0.1% to an upper limit of 8% based on the weight of the total monomer.

8. The paste composition of claim 1, wherein the vehicle comprises microgel particles of a plurality of types which differ in at least one of composition, median particle size, or type or amount of crosslinker.

9. The paste composition of claim 8, wherein the vehicle comprises microgel particles of two types.

10. The paste composition of claim 1, wherein the microgel is present in an amount ranging from a lower limit of 0.05% to an upper limit of 5% by weight of the paste composition.

11. The paste composition of claim 1, wherein the organopolysiloxane comprises polydimethylsiloxane in an amount ranging from a lower limit of 0.05% to an upper limit of 2% by weight of the paste composition.

12. The paste composition of claim 1, wherein the electrically conductive metal comprises silver.

13. The paste composition of claim 1, wherein the source of electrically conductive metal comprises 85 to 99.75% by weight of the solids.

14. The paste composition of claim 1, wherein the oxide-based component comprises 0.25 to 15% by weight of the solids.

15. The paste composition of claim 1, wherein the inorganic oxide-based component comprises a lead tellurium oxide glass frit that optionally comprises at least one of 0.25 to 5 wt % $B_2O_3$ or 0.1 to 5 wt % $Li_2O$.

16. A process comprising:
(a) providing a semiconductor substrate having opposing first and second major surfaces and an insulating layer situated on at least the first major surface;
(b) applying a paste composition as recited by claim 1 onto at least a portion of the insulating layer on the first major surface, and
(c) firing the semiconductor substrate and the paste composition under conditions sufficient to penetrate the insulating layer and form an electrode in electrical contact with the semiconductor substrate.

17. An article made by the process of claim 16.

18. The article of claim 17, wherein the article comprises a photovoltaic cell.

19. A photovoltaic cell precursor, comprising:
(a) a substrate having opposing first and second major surfaces; and
(b) a paste composition as recited by claim 1, the paste composition being applied onto a preselected portion of the first major surface and configured to be formed by a firing operation into an electrically conductive structure comprising an electrode in electrical contact with the substrate.

20. The paste composition of claim 1, wherein the organopolysiloxane has a number average molecular weight ($M_n$) of 5 to 150 kilodaltons.

21. The paste composition of claim 20, wherein the organopolysiloxane has a number average molecular weight ($M_n$) of 50 to 150 kilodaltons.

22. A paste composition, comprising:
an inorganic solids portion that comprises:
(a) a source of electrically conductive metal, and
(b) an inorganic oxide-based component, and
a vehicle in which the constituents of the inorganic solids portion are dispersed, the vehicle comprising:
(c) microgel particles;
(d) organopolysiloxane that is phase-segregated in the vehicle; and
(e) a solvent.

* * * * *